(12) United States Patent
Bauder et al.

(10) Patent No.: US 11,005,449 B2
(45) Date of Patent: May 11, 2021

(54) ACOUSTICALLY COUPLED RESONATOR NOTCH AND BANDPASS FILTERS

(71) Applicant: Infineon Technologies AG, Neubiberg (DE)

(72) Inventors: Ruediger Bauder, Feldkirchen-Westerham (DE); Andreas Bogner, Munich (DE); Hans-Joerg Timme, Ottobrunn (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 16/210,703

(22) Filed: Dec. 5, 2018

(65) Prior Publication Data

US 2019/0190490 A1 Jun. 20, 2019

Related U.S. Application Data

(60) Provisional application No. 62/641,664, filed on Mar. 12, 2018, provisional application No. 62/595,898, filed on Dec. 7, 2017.

(30) Foreign Application Priority Data

Dec. 5, 2018 (EP) ..................... 18210357

(51) Int. Cl.
*H03H 9/54* (2006.01)
*H03H 9/58* (2006.01)
(Continued)

(52) U.S. Cl.
CPC ............... *H03H 9/547* (2013.01); *H03F 3/19* (2013.01); *H03F 3/21* (2013.01); *H03H 3/02* (2013.01);
(Continued)

(58) Field of Classification Search
CPC ........ H03H 9/547; H03H 9/0547; H03H 9/60; H03H 9/584; H03H 3/02; H03H 9/02007;
(Continued)

(56) References Cited

U.S. PATENT DOCUMENTS 2,271,870 A 2/1942 Mason
4,013,982 A 3/1977 Wood et al.
(Continued)

FOREIGN PATENT DOCUMENTS

EP 1381163 A1 1/2004
FR 2235532 A1 1/1975
(Continued)

OTHER PUBLICATIONS

Bauer, Thomas et al., "SAW Band Rejection Filters for Mobile Digital Television," IEEE International Ultrasonics Symposium Proceedings, Nov. 2-5, 2008, pp. 288-291. DOI: 10.1109/ULTSYM.2008.0071.
(Continued)

*Primary Examiner* — Robert J Pascal
*Assistant Examiner* — Jorge L Salazar, Jr.
(74) *Attorney, Agent, or Firm* — Slater Matsil, LLP

(57) ABSTRACT

A notch filter includes an inductor coupled between an input node and an output node, and a dual-resonator structure coupled between the input node, the output node, and ground.

20 Claims, 27 Drawing Sheets

(51) Int. Cl.

| | | |
|---|---|---|
| *H03H 7/01* | (2006.01) | |
| *H03H 9/64* | (2006.01) | |
| *H03H 9/52* | (2006.01) | |
| *H03H 9/05* | (2006.01) | |
| *H03H 9/60* | (2006.01) | |
| *H04B 1/00* | (2006.01) | |
| *H03H 3/02* | (2006.01) | |
| *H03H 11/12* | (2006.01) | |
| *H04B 1/10* | (2006.01) | |
| *H04B 1/40* | (2015.01) | |
| *H03H 9/02* | (2006.01) | |
| *H03H 9/17* | (2006.01) | |
| *H03H 9/48* | (2006.01) | |
| *H03H 9/00* | (2006.01) | |
| *H03H 9/66* | (2006.01) | |
| *H04B 1/04* | (2006.01) | |
| *H04B 1/50* | (2006.01) | |
| *H03H 7/12* | (2006.01) | |
| *H03H 7/46* | (2006.01) | |
| *H04B 1/525* | (2015.01) | |
| *H03F 3/19* | (2006.01) | |
| *H03F 3/21* | (2006.01) | |
| *H03H 9/70* | (2006.01) | |
| *H04B 1/18* | (2006.01) | |
| *H03J 3/20* | (2006.01) | |
| *H03H 9/205* | (2006.01) | |
| *H01L 41/187* | (2006.01) | |
| *H03J 1/00* | (2006.01) | |

(52) U.S. Cl.
CPC ........ *H03H 7/0115* (2013.01); *H03H 7/0153* (2013.01); *H03H 7/0161* (2013.01); *H03H 7/12* (2013.01); *H03H 7/1741* (2013.01); *H03H 7/463* (2013.01); *H03H 9/0004* (2013.01); *H03H 9/02007* (2013.01); *H03H 9/02015* (2013.01); *H03H 9/02031* (2013.01); *H03H 9/0547* (2013.01); *H03H 9/175* (2013.01); *H03H 9/205* (2013.01); *H03H 9/48* (2013.01); *H03H 9/52* (2013.01); *H03H 9/54* (2013.01); *H03H 9/542* (2013.01); *H03H 9/584* (2013.01); *H03H 9/585* (2013.01); *H03H 9/60* (2013.01); *H03H 9/6479* (2013.01); *H03H 9/66* (2013.01); *H03H 9/70* (2013.01); *H03H 11/1291* (2013.01); *H03J 3/20* (2013.01); *H04B 1/006* (2013.01); *H04B 1/0057* (2013.01); *H04B 1/0475* (2013.01); *H04B 1/10* (2013.01); *H04B 1/1036* (2013.01); *H04B 1/18* (2013.01); *H04B 1/40* (2013.01); *H04B 1/50* (2013.01); *H04B 1/525* (2013.01); *H01L 41/187* (2013.01); *H03F 2200/222* (2013.01); *H03F 2200/294* (2013.01); *H03F 2200/451* (2013.01); *H03F 2203/21157* (2013.01); *H03H 9/587* (2013.01); *H03H 9/588* (2013.01); *H03H 9/589* (2013.01); *H03H 9/605* (2013.01); *H03H 2007/013* (2013.01); *H03H 2009/02204* (2013.01); *H03H 2210/025* (2013.01); *H03H 2210/026* (2013.01); *H03J 1/0008* (2013.01)

(58) Field of Classification Search
CPC .............. H03H 9/205; H03H 11/1291; H03H 9/02015; H03H 9/175; H03H 9/48; H03H 9/585; H03H 7/0161; H03H 9/0004; H03H 9/66; H03H 7/12; H03H 7/463; H03H 7/0115; H03H 9/542; H03H 9/70; H03H 7/1741; H03H 9/02031; H03H 7/0153; H03H 9/54; H03H 9/6479; H03H 9/52; H03H 2210/026; H03H 9/587; H03H 9/589; H03H 2009/02204; H03H 9/588; H03H 9/605; H03H 2007/013; H03H 2210/025; H04B 1/006; H04B 1/10; H04B 1/40; H04B 1/0057; H04B 1/0475; H04B 1/50; H04B 1/525; H04B 1/1036; H04B 1/18; H04B 1/005; H03F 3/19; H03F 3/21; H03F 2203/21157; H03F 2200/222; H03F 2200/294; H03F 2200/451; H03F 3/195; H03J 3/20; H03J 1/0008; H01L 41/187
USPC ................................ 333/133, 187, 188, 189
See application file for complete search history.

(56) References Cited

U.S. PATENT DOCUMENTS

| | | |
|---|---|---|
| 5,128,625 A | 7/1992 | Yatsuzuka et al. |
| 5,729,829 A | 3/1998 | Talwar et al. |
| 5,774,193 A | 6/1998 | Vaughan |
| 5,864,261 A | 1/1999 | Weber et al. |
| 6,072,996 A | 6/2000 | Smith |
| 6,472,959 B1 | 10/2002 | Beaudin et al. |
| 7,535,324 B2 | 5/2009 | Fattinger et al. |
| 7,825,745 B1 | 11/2010 | Gavin et al. |
| 8,018,303 B2 | 9/2011 | Handtmann et al. |
| 8,682,260 B1 | 3/2014 | Granger-Jones et al. |
| 8,841,819 B2 | 9/2014 | Nishihara et al. |
| 9,461,618 B2 * | 10/2016 | Pang ....................... H03H 9/54 |
| 9,787,334 B2 | 10/2017 | Obiya et al. |
| 2001/0017504 A1 | 8/2001 | Aigner et al. |
| 2002/0163404 A1 | 11/2002 | Sonoda et al. |
| 2002/0164961 A1 | 11/2002 | Atkinson et al. |
| 2002/0183016 A1 | 12/2002 | Kemmochi et al. |
| 2004/0012570 A1 | 1/2004 | Cross et al. |
| 2004/0051601 A1 | 3/2004 | Frank |
| 2004/0127178 A1 | 7/2004 | Kuffner |
| 2004/0204814 A1 | 10/2004 | Honda |
| 2005/0012570 A1 | 1/2005 | Korden et al. |
| 2005/0069065 A1 | 3/2005 | Oh et al. |
| 2005/0099244 A1 | 5/2005 | Nakamura et al. |
| 2005/0148312 A1 | 7/2005 | Toncich et al. |
| 2005/0245213 A1 | 11/2005 | Hirano et al. |
| 2006/0176126 A1 | 8/2006 | Wang et al. |
| 2006/0229030 A1 | 10/2006 | Simon et al. |
| 2007/0024395 A1 | 2/2007 | Takako |
| 2007/0176710 A1 | 8/2007 | Jamneala et al. |
| 2008/0028585 A1 | 2/2008 | Barber et al. |
| 2008/0048802 A1 | 2/2008 | Kigner et al. |
| 2008/0152049 A1 | 6/2008 | Sandner et al. |
| 2008/0169884 A1 | 7/2008 | Matsumoto et al. |
| 2009/0265903 A1 | 10/2009 | Handtmann et al. |
| 2009/0273416 A1 | 11/2009 | Nakatsuka et al. |
| 2010/0118921 A1 | 5/2010 | Abdelmonem et al. |
| 2012/0007696 A1 | 1/2012 | Pang et al. |
| 2012/0086522 A1 | 4/2012 | Mao et al. |
| 2012/0235877 A1 | 9/2012 | Beaudin et al. |
| 2012/0286900 A1 | 11/2012 | Kadota et al. |
| 2013/0077540 A1 | 3/2013 | Black et al. |
| 2013/0122831 A1 | 5/2013 | Desclos et al. |
| 2013/0176912 A1 | 7/2013 | Khlat |
| 2014/0003300 A1 | 1/2014 | Weissman et al. |
| 2014/0038531 A1 | 2/2014 | Hayafuji et al. |
| 2014/0145799 A1 | 5/2014 | Jian et al. |
| 2014/0162712 A1 | 6/2014 | Feld et al. |
| 2014/0313947 A1 | 10/2014 | Ali-Ahmad |
| 2015/0163747 A1 | 6/2015 | Chen et al. |
| 2015/0171819 A1 | 6/2015 | Asan et al. |
| 2015/0214985 A1 | 7/2015 | Lee et al. |
| 2015/0236748 A1 | 8/2015 | Nobbe |
| 2016/0112072 A1 | 4/2016 | Bauder et al. |
| 2016/0204763 A1 | 7/2016 | Tani |
| 2016/0365841 A1 | 12/2016 | Dickerson |
| 2017/0054485 A1 | 2/2017 | Wang et al. |

(56) References Cited

U.S. PATENT DOCUMENTS

| | | |
|---|---|---|
| 2017/0264268 A1 | 9/2017 | Schmidhammer |
| 2017/0301992 A1 | 10/2017 | Khlat et al. |
| 2017/0310302 A1 | 10/2017 | Bauder et al. |
| 2018/0062674 A1 | 3/2018 | Boghrat et al. |
| 2018/0205367 A1 | 7/2018 | Sovero et al. |
| 2019/0372190 A1 | 12/2019 | Kord et al. |

FOREIGN PATENT DOCUMENTS

| | | |
|---|---|---|
| GB | 2431062 A | 4/2007 |
| GB | 2457607 B | 11/2009 |
| JP | S5252348 A | 4/1977 |
| JP | H02199994 A | 8/1990 |
| JP | 2009290365 A | 12/2009 |
| WO | 9817000 A1 | 4/1998 |
| WO | 0103314 A1 | 1/2001 |
| WO | 2007149954 A1 | 12/2007 |
| WO | 2015183548 A1 | 12/2015 |
| WO | 2017204833 A1 | 11/2017 |

OTHER PUBLICATIONS

Gopani, S., et al,. "SAW waveguide-coupled resonator notch filter," IEEE International Ultrasonic Symposium, Dec. 4-7, 1990, pp. 1-5. DOI: 10.1109/ULTSYM.1990.171317.

Handtmann, "Stacked Crystal Resonator: A Highly Linear BAW Device," IEEE International Ultrasonics Symposium, Sep. 20-23, 2009, pp. 889-892.

Hashimoto, Ken-ya et al., "Moving Tunable Filters Forward. A Heterointegration Research Project for Tunable Filters Combining MEMS and RF SAWVBAW Technologies," IEEE Microwave, vol. 16, Issue 7, Aug. 2015, pp. 39-97. DOI: 10.1109/MMM.2015.2431237.

Huang, Yulin et al., "Design Consideration of SAW/BAW Band Reject Filters Embedded in Impedance Converter," IEEE Transactions on Ultrasonics, Ferroelectrics, and Frequency Control, vol. 64, Issue 9, Sep. 2017, pp. 1368-1374. DOI: 10.1109/TUFFC.2017.2713395.

Mourot, Loic et al., "Stopband filters built in the BAW technology," Application Notes, IEEE Microwave, vol. 9, Issue 5, Oct. 2008, pp. 104-116. DOI: 10.1109/MMM.2008.927635.

Obiya, H., et al., "A New Tunable RF Front-End Circuit for Advanced 4G Handsets," IEEE MTT-S Int. Microwave Symp. Digest, Session WEP-54, Jun. 2014, 3 pages.

Ogami, T., et al., "A New Tunable Filter Using Love Wave Resonators for Reconfigurable RF," 2014 IEEE MTT-S Int. Microwave Symp. Digest, session TU3A-2, Jun. 2014, 3 pages.

Psychogiou, Dimitra et al., "High-Q Bandstop Filters Exploiting Acoustic-Wave-Lumped-Element Resonators (AWLRs)," IEEE Trans. Circuits Syst. II: Express Briefs, vol. 63, No. 1, Jan. 2016, pp. 79-83. DOI: 101109/TCSII.2015.2505078.

Rais-Zadeh, Mina et al., "Reconfigurable Radios: A Possible Solution to Reduce Entry Costs in Wireless Phones," Proc. IEEE, vol. 103, Issue 3, Mar. 2015, pp. 438-451. DOI: 10.1109/JPROC.2015.2396903.

Reinhardt, Alexandre et al., "Tunable composite piezoelectric resonators: a possible 'Holy Grail' of RF filters?," IEEE/MTT-S International Microwave Symposium, Jun. 17-22, 2012, 3 pages.

Ruby, Rich "A Snapshot in Time. The Future in Filters for Cell Phones," IEEE Microwave, vol. 16, Issue 7, Aug. 2015, pp. 46-59. DOI: 10.1109/MMM.2015.2429513.

Ruppel, Clemens "Acoustic Wave Filter Technology—A Review," IEEE Trans. Ultrason., Ferroelect., Freq. Contr, Apr. 4, 2017, pp. 1390-1400, DOI: 10.1109/TUFFC.2017.2690905.

Ud Din, Imad et al., "Two Tunable Frequency Duplexer Architectures for Cellular Transceivers," IEEE Transactions on Circuits and Systems I: Regular Papers, vol. 64, Issue 11, Nov. 2017, pp. 2988-2999.

Van Liempd, Barend et al., "A +70 dBm IIP3 Electrical-Balance Duplexer for Highly-Intergated Tubable Front-Ends," IEEE Transactions on Microwave Theory and Techniques, vol. 64, Issue 12, Dec. 2016, pp. 4274-4286.

Wada, T., et al., "A Miniaturized Broadband Lumped Element Circulator for Reconfigurable Front-end System," 2014 IEEE MTT-S Int. Microwave Symp. Digest, session WEP-28, Jun. 1-6, 2014, 3 pages.

Warder, Phil, "Golden Age for Filter Design. Innovative and Proven Approaches for Acoustic Filter, Duplexer, and Multiplexer Design," IEEE Microwave, vol. 16, Issue 7, Aug. 2015, pp. 60-72. DOI: 10.1109/MMM.2015.2431236.

Frederick, Amanda A., et al., "Frequency tuning of film bulk acoustic resonators," Proceedings of SPIE Smart Structures and Materials + Nondestructive Evaluation and Health Monitoring, San Diego, CA, US, Mar. 31, 2006, 10 pages.

Zhou, Chong et al., "Design of GSM/DCS Dual-Band Bulk Acoustic Wave Coupled Resonator Filter with Unified Input", IEEE Symposium on Piezoelectricity, Acoustic Waves and Device Applications (SPAWDA), Shenzhen, China, Dec. 9-11, 2011, 4 pages.

El Hassan, M., et al., "Techniques for Tuning BAW-SMR Resonators for the 4th Generation of Mobile Communications," INTECH Open Science Open Minds, Chapter 18, http://dx.doi.org/10.5772/55131, Aug. 28, 2013, 22 pages.

Garrison, J.L., et al., "Bell System Technical Journal," American Telephone and Telegraph Co., New York, U.S., vol. 53, No. 10, pages, Dec. 1974, pp. 2203-2248.

Lakin, K.M., "Thin Film Resonator Technology," IEEE International Frequency Control Symposium and PDA Exhibition Jointly with the 17th European Frequency and Time Forum, New York, May 4, 2003, pp. 765-778.

Carpentier, J.F., et al., "A Tunable Bandpass BAW-Filter Architecture and Its Application to WCDMA Filter", IEEE Radio Frequency Integrated Circuits Symposium, Jun. 15, 107, 2008, pp. 221-224.

Chen, Jay et al., "In-line process monitoring of advanced packaging process using focused beam ellipsometry", Chip Scale Review, May-Jun. 2015, pp. 34-38.

Lau, John H. "Evolution and Outlook of TSV and 3D IC/Si Integration", 12th IEEE Electronics Packaging Technology Conference, Dec. 8-10, 2010, pp. 560-570.

Nishihara, Tokihiro et al., "BAS/SAW/IPD hybrid type duplexer with Rx balanced output for WCDMA Band I", IEEE MTT-S International Microwave Symposium Digest, Jun. 15-20, 2008, pp. 831-834.

Siemens AG "Integrate IC Chips and Passives Components with TSV for SiP", Ip.com, Prior Art Database, Technical Disclosure, Ip.Com No. IPCOM000174770D, Oct. 13, 2008, 2 pages.

Shirakawa, A. A., et al., "Bulk Acoustic Wave Coupled Resonator Filters Synthesis Methodology", IEEE European Microwave Conference, Oct. 4-6, 2005, 4 pages.

Shirakawa, Alexandre A., et al., "A Mixed Ladder-Lattice Bulk Acoustic Wave Duplexer for W-CDMA Handsets", IEEE International Conference on Electronics, Circuits and Systems, Dec. 11-14, 2007, 4 pages.

Sun, X., et al., "3D stack packaging solution for BAW devices—3D packaging demonstrator and RF performance", EPCOS AG, IEEE Proceedings of the European Solid-State Device Research Conference, Sep. 120-16, 2011, 4 pages.

Volatier, A., et al., "Design, elaboration and characterization of Coupled Resonator Filters for WCDMA applications", IEEE Ultrasonics Symposium, Oct. 2-6, 2006, 4 pages.

\* cited by examiner

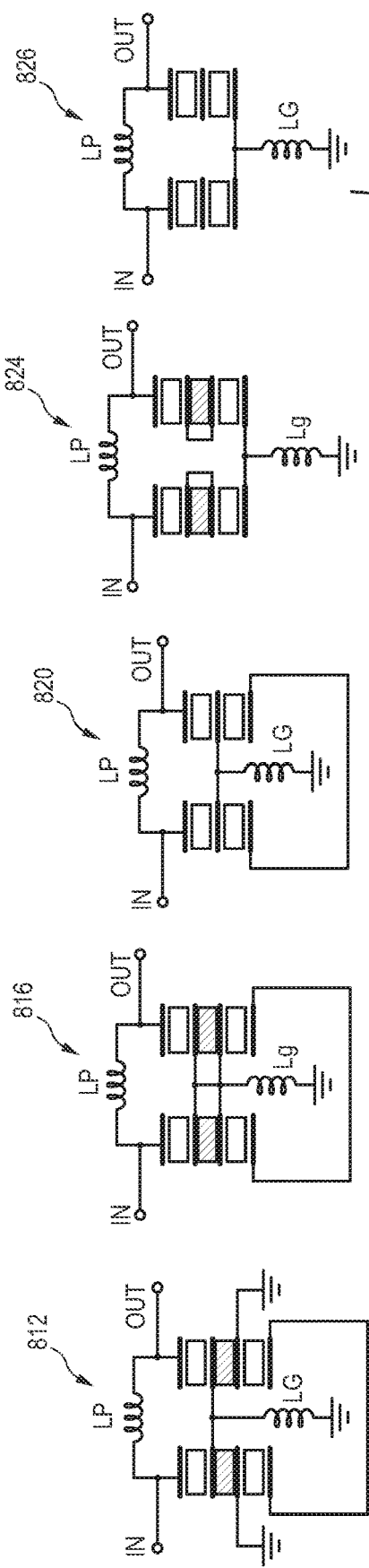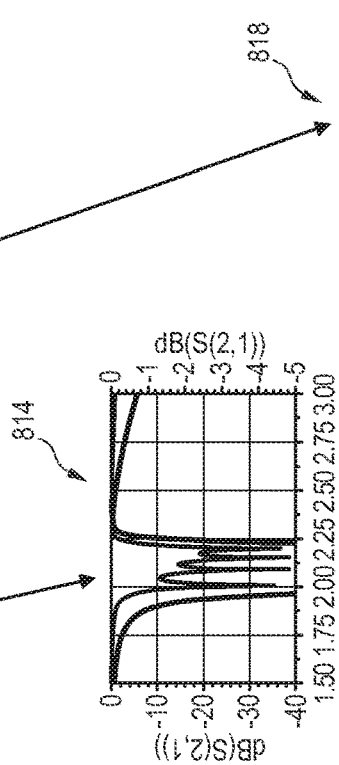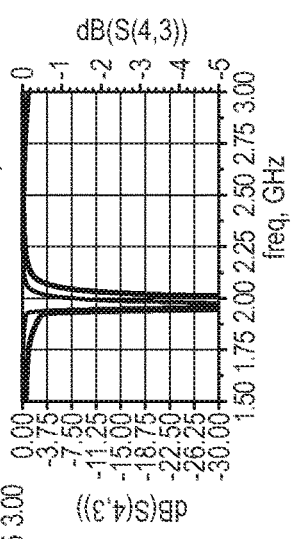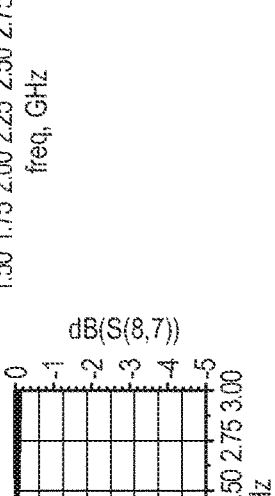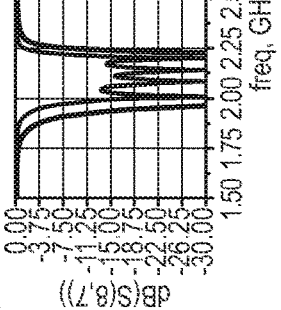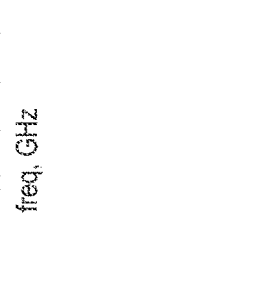

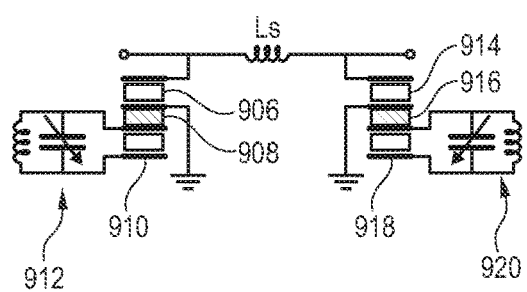
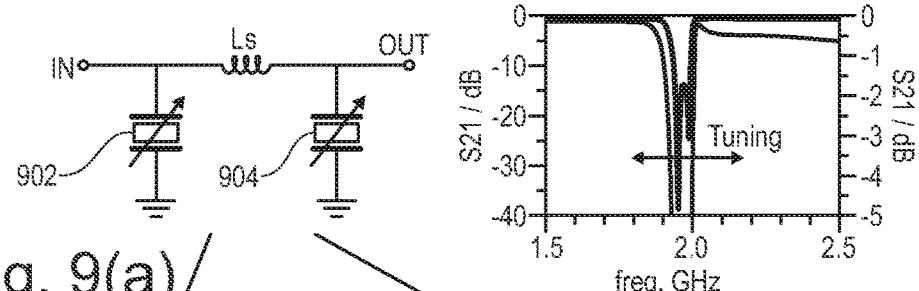
Fig. 9(a)
Fig. 9(d)
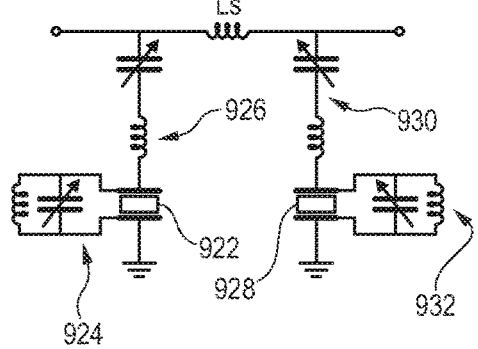
Fig. 9(b)
Fig. 9(c)
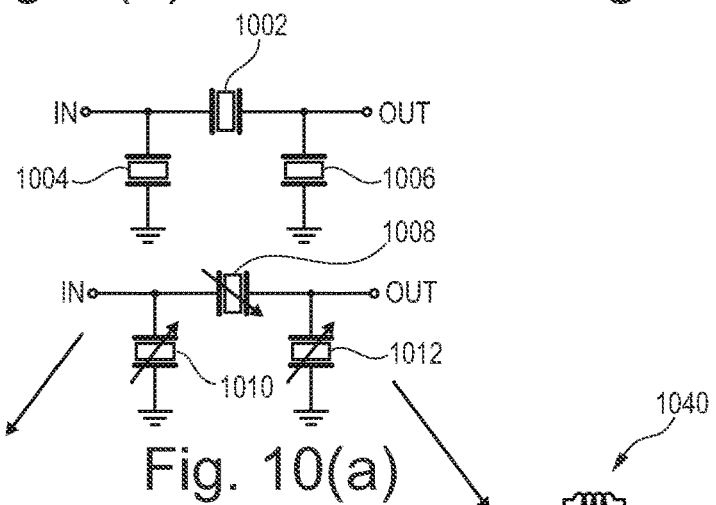
Fig. 10(a)
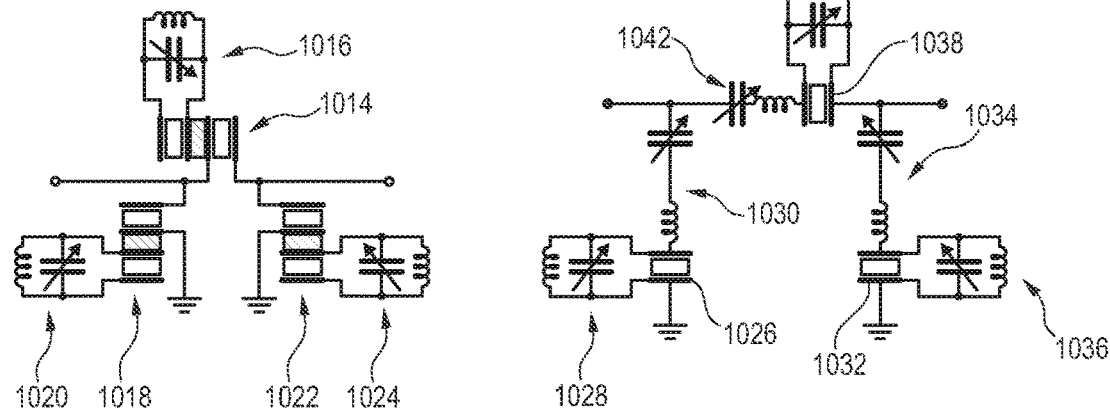
Fig. 10(b)
Fig. 10(c)

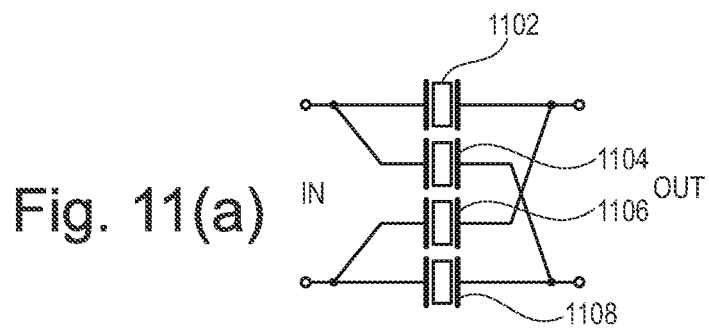
Fig. 11(a)
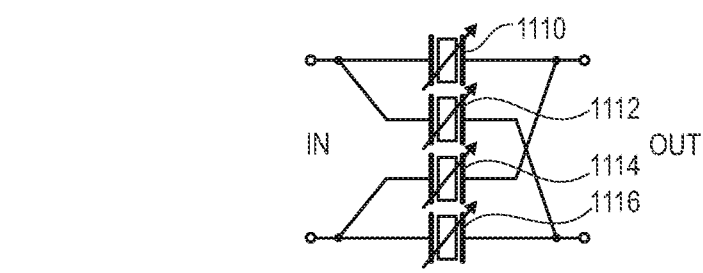
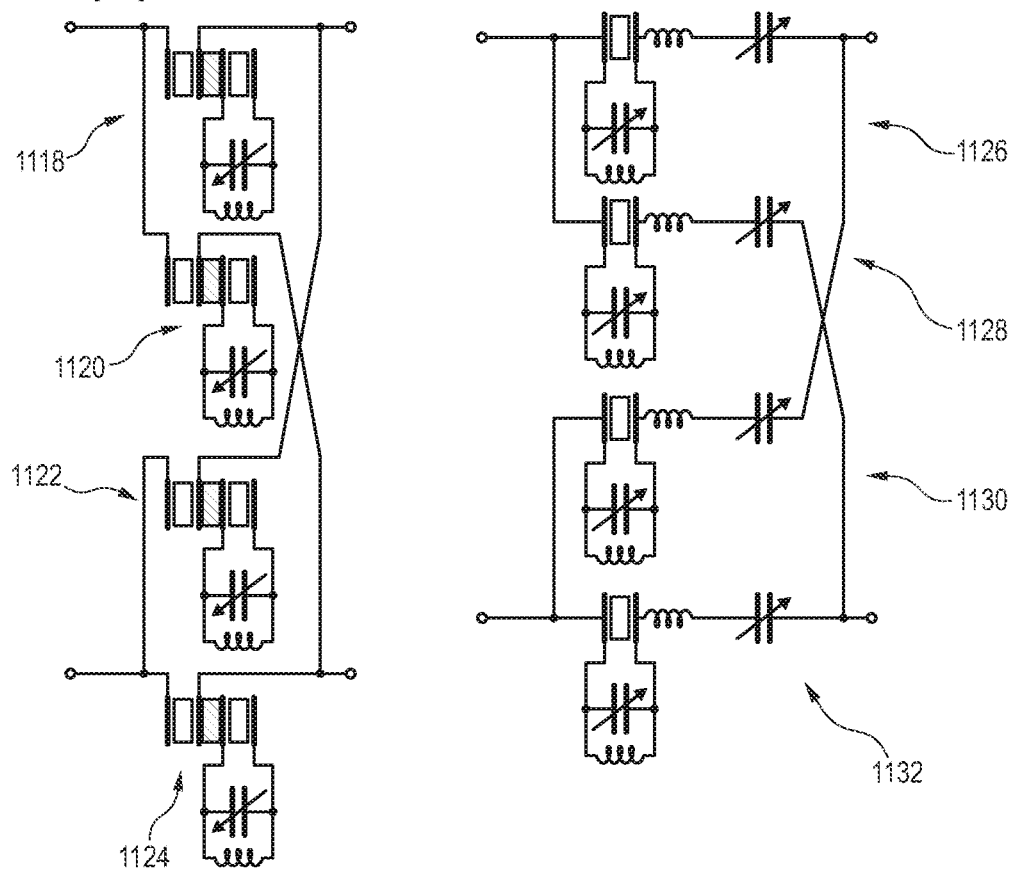
Fig. 11(b)   Fig. 11(c)

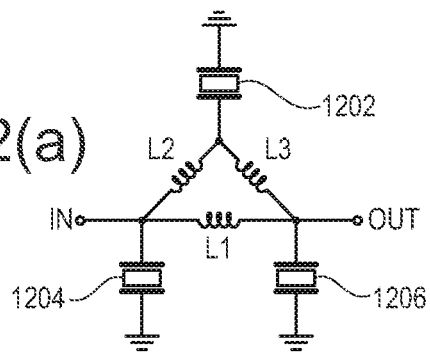
Fig. 12(a)
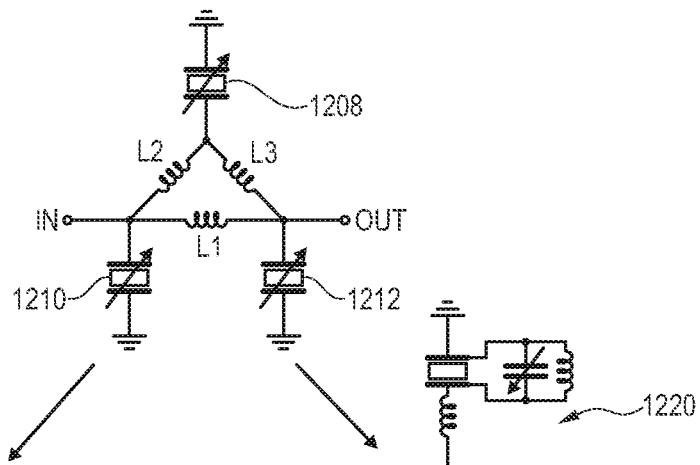
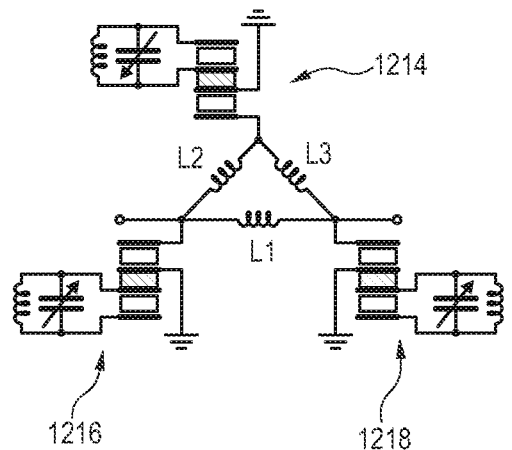
Fig. 12(b)           Fig. 12(c)

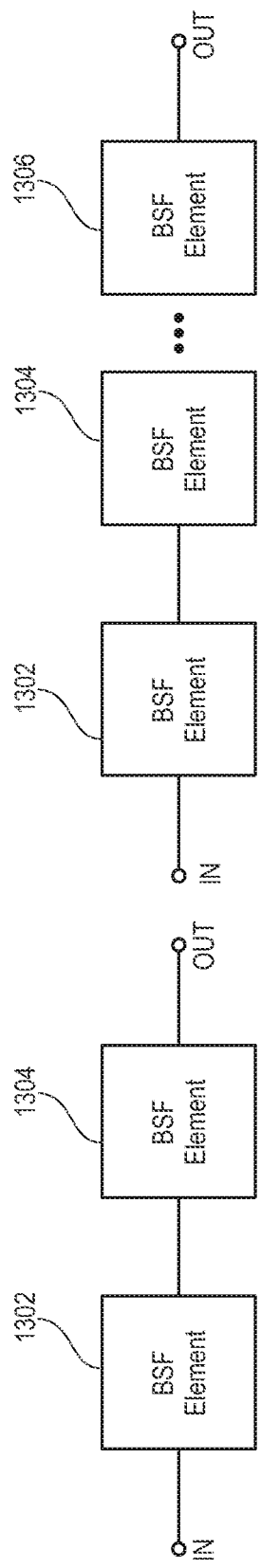
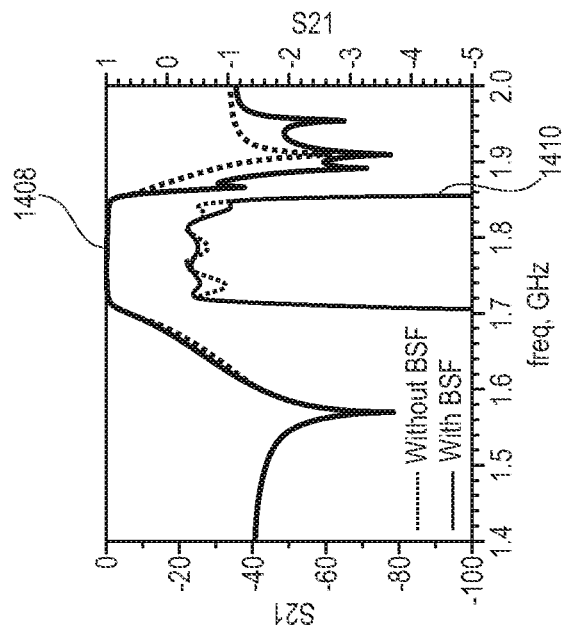
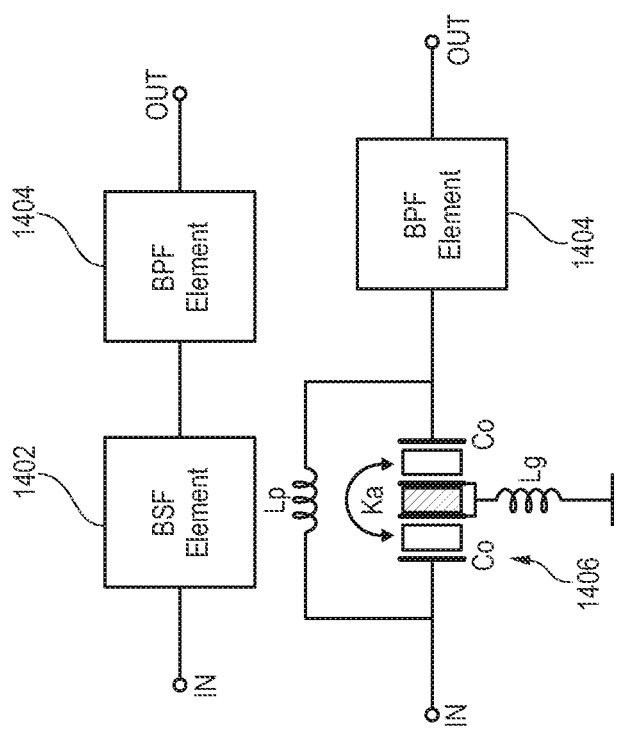

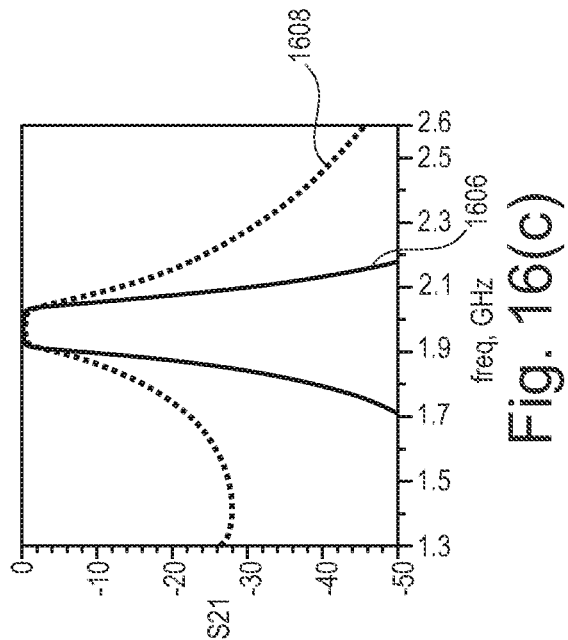
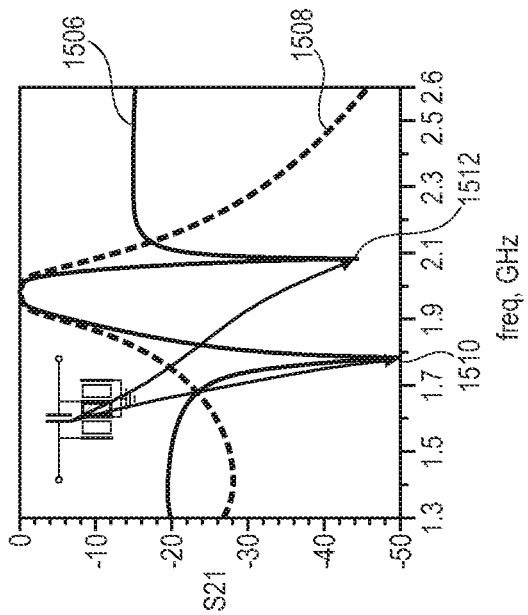
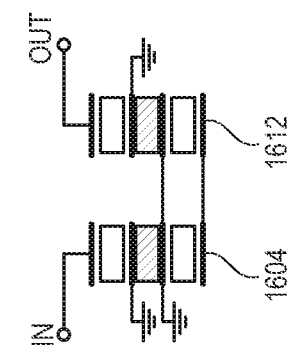
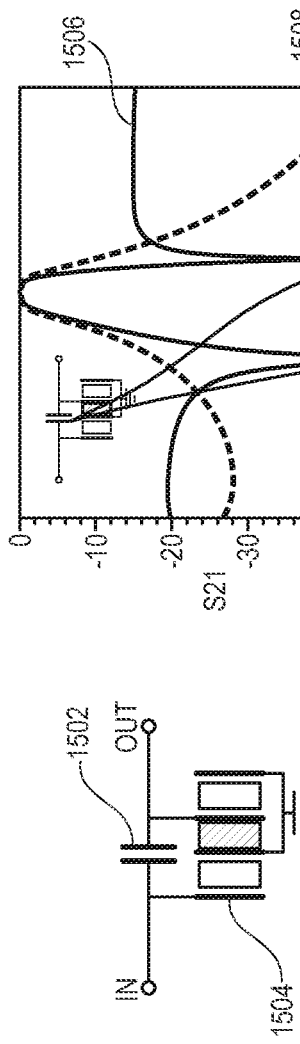
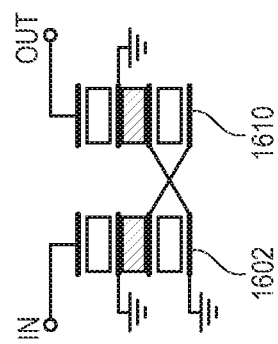

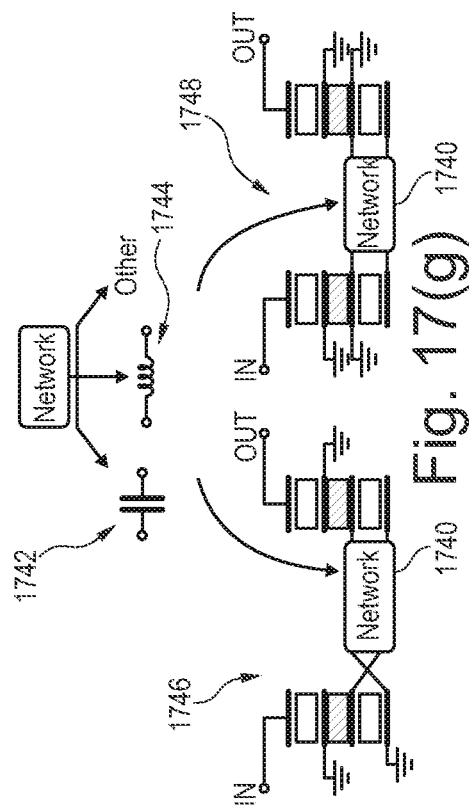
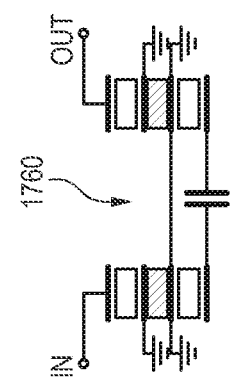
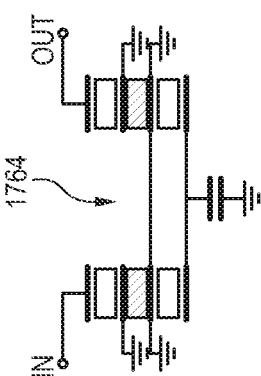
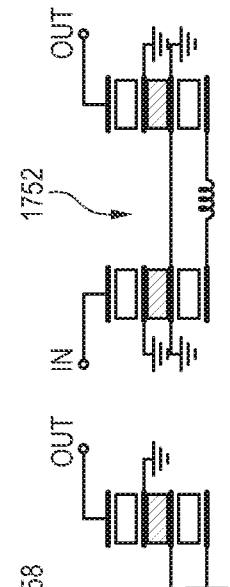
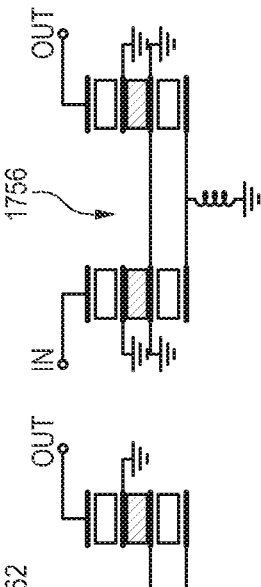
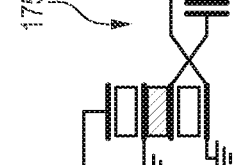

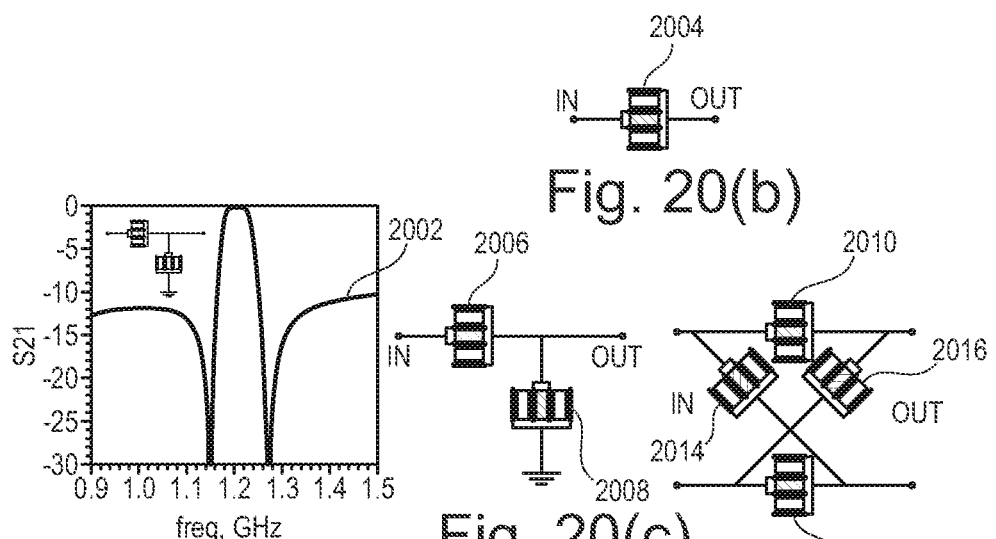
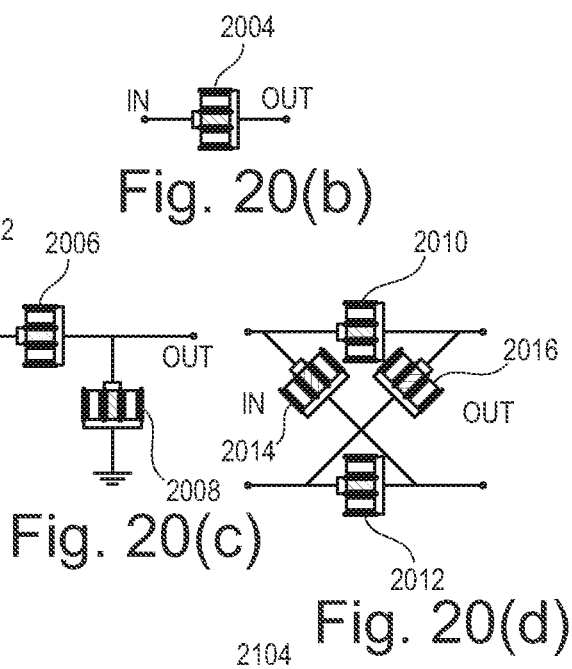
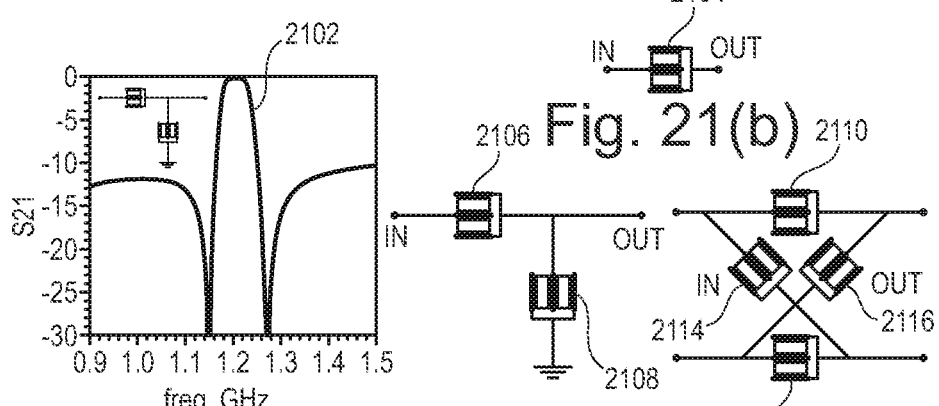
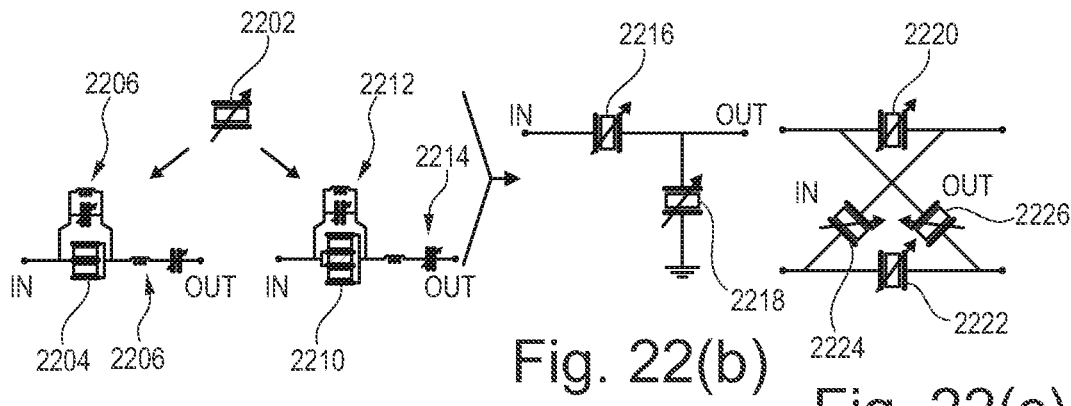

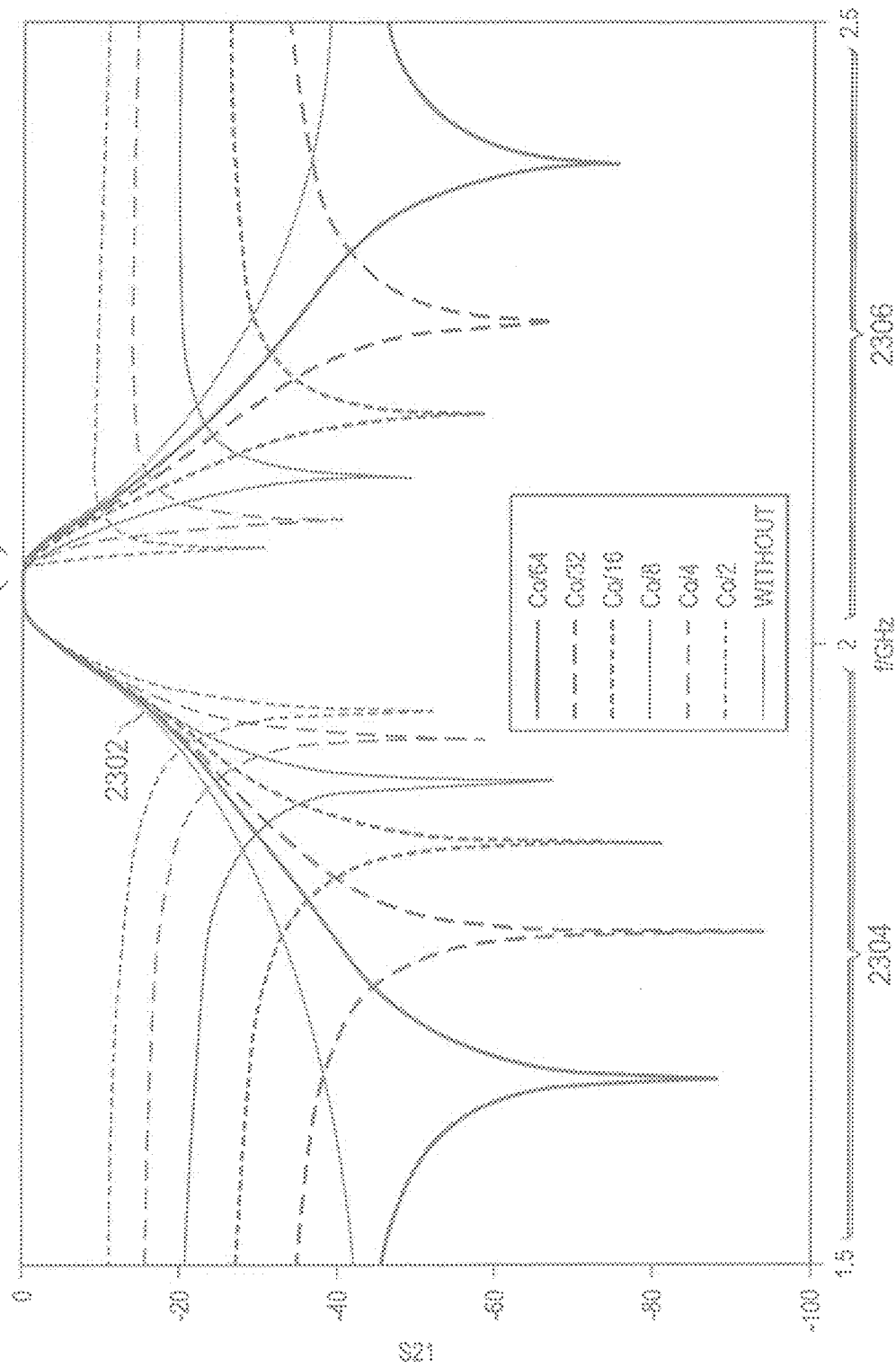

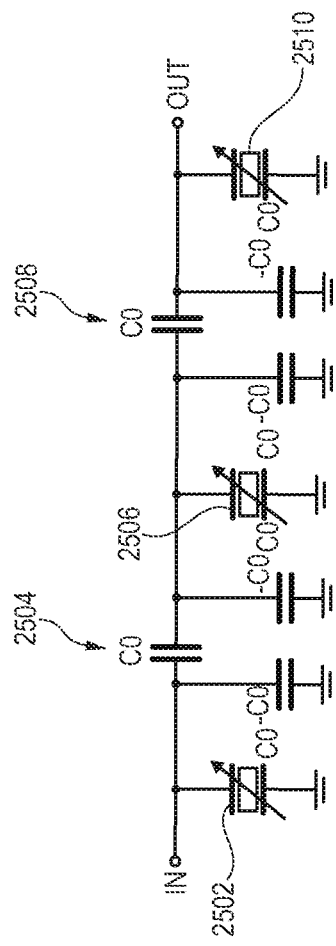
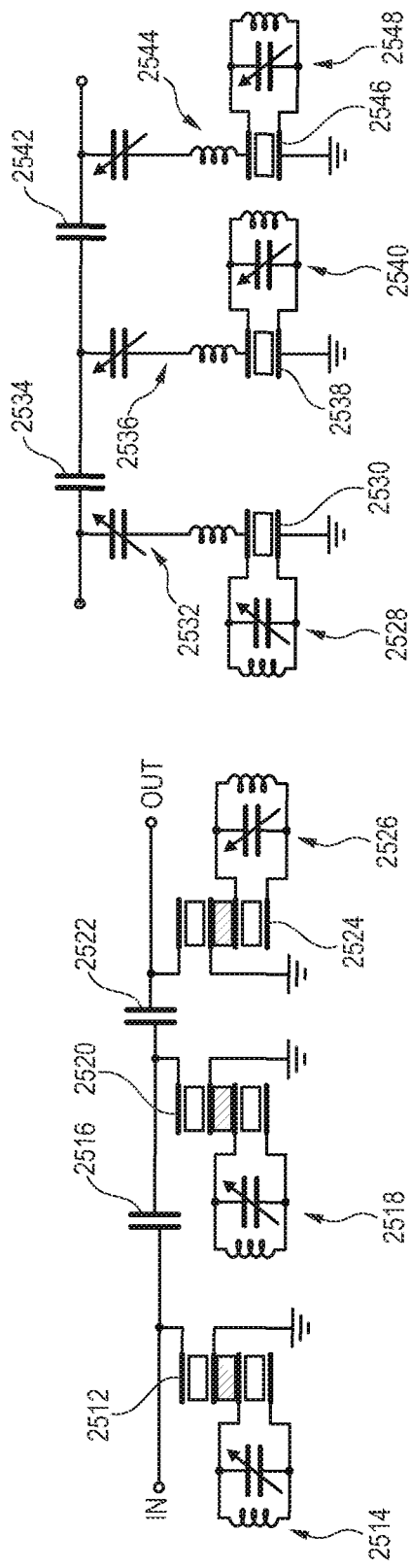
Fig. 25(a)
Fig. 25(b)
Fig. 25(c)

ACOUSTICALLY COUPLED RESONATOR NOTCH AND BANDPASS FILTERS

This application claims the benefit of U.S. Provisional Application No. 62/595,898, filed on Dec. 7, 2017, and the benefit of U.S. Provisional Application No. 62/641,664, filed on Mar. 12, 2018, and claims priority to European Application No. 18210357.2, filed Dec. 5, 2018 that also claims priority to U.S. Provisional Applications 62/595,898 and 62/641,664, which applications are hereby incorporated herein by reference in their entireties.

CROSS-REFERENCE TO RELATED APPLICATIONS

This application relates to the following co-pending and commonly assigned patent applications: U.S. patent application Ser. No. 16/210,610, filed on Dec. 5, 2018; U.S. patent application Ser. No. 16/210,582, filed on Dec. 5, 2018; U.S. patent application Ser. No. 16/210,732, filed on Dec. 5, 2018, U.S. patent application Ser. No. 16/210,555, filed on Dec. 5, 2018, U.S. patent application Ser. No. 16/210,756, filed on Dec. 5, 2018, U.S. patent application Ser. No. 16/210,788, filed on Dec. 5, 2018, U.S. patent application Ser. No. 16/210,812, filed on Dec. 5, 2018, U.S. patent application Ser. No. 16/210,637, filed on Dec. 5, 2018, U.S. patent application Ser. No. 16/210,670, filed on Dec. 5, 2018, which applications are incorporated herein by reference in their entirety.

TECHNICAL FIELD

The present invention relates generally to an acoustically coupled resonator notch filter, and, in particular embodiments, to a system and method therefor.

BACKGROUND

Today's wireless communication standards such as e.g. Long-Term Evolution ("LTE") require highly-selective frequency filters for a multitude of different frequency bands. Being able to serve a high number of frequency bands is especially important to allow operation of a mobile phone in different countries with corresponding specific choices/standards of frequency bands.

SUMMARY

According to an embodiment, a notch filter comprises a first inductor coupled between an input node and an output node; a dual-resonator structure coupled between the input node and the output node; and a second inductor coupled between the dual-resonator structure and ground.

According to another embodiment, a notch filter comprises an inductor coupled between an input node and an output node; and a dual-resonator structure coupled between the input node, the output node, and ground.

According to another embodiment, a bandpass filter comprises a capacitor coupled between an input node and an output node; and a dual-resonator structure coupled between the input node, the output node, and ground.

BRIEF DESCRIPTION OF THE DRAWINGS

For a more complete understanding of the present invention, and the advantages thereof, reference is now made to the following descriptions taken in conjunction with the accompanying drawings, in which:

FIGS. 8(c), (d), (e), (f), and (g) are schematic diagrams of additional notch filter embodiments, and graphs of the corresponding frequency response;

FIGS. 9(a), (b), and (c) are schematic diagrams of tunable notch filters according to embodiments;

FIG. 9(d) is a graph of the frequency response of the filters of FIGS. 9(a), (b), and (c);

FIGS. 10(a), (b), and (c) are schematic diagrams of tunable ladder based notch filters according to embodiments;

FIGS. 11(a), (b), and (c) are schematic diagrams of tunable quasi lattice based notch filters according to embodiments;

FIGS. 12(a), (b), and (c) are schematic diagrams of tunable all-pass triplets filters according to embodiments;

FIGS. 13(a) and (b) is a block diagram of cascaded BandStop Filters ("BSF") according to an embodiment;

FIG. 14(a) is a schematic diagram of cascaded BSF and BandPass Filters ("BPF") according to an embodiment;

FIG. 14(b) is a graph of the frequency response of the cascaded filters shown in FIG. 14(a);

FIG. 15(a) is a schematic diagram of a single CRF bandpass filter with a parallel feedback capacitance according to an embodiment;

FIG. 15(b) is a graph of the frequency response of the filter shown in FIG. 15(a);

FIGS. 16(a) and (b) are schematic diagrams of series-coupled CRF bandpass filters according to embodiments;

FIG. 16(c) is a graph of the frequency response of the filters shown in FIGS. 16(a) and (b);

FIGS. 20(b), (c), and (d) are schematic diagrams of ladder/lattice bandpass filters using CRF resonator structures according to embodiments;

FIG. 20(a) is a graph of the frequency response of the filters shown in FIGS. 20(b), (c), and (d);

FIGS. 21(b), (c), and (d) are schematic diagrams of ladder/lattice bandpass filters using SCF resonator structures according to embodiments;

FIG. 21(a) is a graph of the frequency response of the filters shown in FIGS. 21(b), (c), and (d);

FIGS. 22(a), (b), and (c) show schematic diagrams of tunable ladder/lattice bandpass filters using SCF and CRF resonator structures and associated tuning circuits according to embodiments;

FIG. 23(a) is a graph of the frequency response of the filter of FIG. 23(b) without the overlap portion;

FIGS. 25(a), (b), and (c) show schematic diagrams of tunable coupled bandpass filters according to embodiments.

DETAILED DESCRIPTION OF ILLUSTRATIVE EMBODIMENTS

The growing complexity in RF Frontends (e.g. due to the growing number of supported bands) results in higher insertion loss, reduced reference sensitivity and significantly increased area for existing filters. Filter embodiments described herein reduce the area, reduce time to market with a simplified and flexible RF front end design for new upcoming Carrier Aggregation modes and improve reference sensitivity for most use cases when compared to existing filters.

Today, the required highly-selective band pass filters are fabricated in either Surface Acoustic Wave ("SAW") or Bulk Acoustic Wave ("BAW") technologies. In both technologies, filters are realized by combining acoustic resonators in certain circuit topologies like e.g. ladder or lattice filter topologies. Many filters are required to serve all the individual LTE frequency bands (including Wi-Fi). RF switches are then used to select individual filters for the respective signal path between an antenna and a Low Noise Amplifier ("LNA") or Power Amplifier ("PA"), respectively. Altogether, a large number of (mostly discrete) components is required, driving circuit complexity, RF losses, manufacturing complexity, and—last but not least—the needed space (form factor) for RF frontends in mobile communication devices. Finally, power standards will increase to compensate higher losses at higher frequencies. Consequently, higher attenuation requirements must be handled.

Notch filters (also known as band reject filters or stop-band filters) enjoy increasing attention due to the current and future mobile communication requirements. The integration of multiple frequency bands and higher power standards lead to enhanced interference problems and make higher attenuation levels necessary. Despite these needs relatively little work has been published to develop notch (as well as bandpass) filters applying bulk acoustic wave technology.

Many conventional band reject filters include distributed structures and waveguide structure. Hence, they are large and impractical for small integrated solutions. Very recently also SAW/BAW ladder based notch filters were proposed. Generally, these ladder based notch filters benefit from the high Q factors of the SAW/BAW technology. However, these filters suffer from high area consumption and high insertion loss since usually more than one stage is necessary to meet the required specifications. Furthermore, their performance strongly depends on the capacitance ratio of the shunt and series elements. Hence, to exhibit a small out-of-band attenuation, the capacitance of the series elements has to be much larger than the capacitance of the shunt resonators. This leads to high area consumption of the series elements and very small areas of the shunt elements.

Figure 1A:
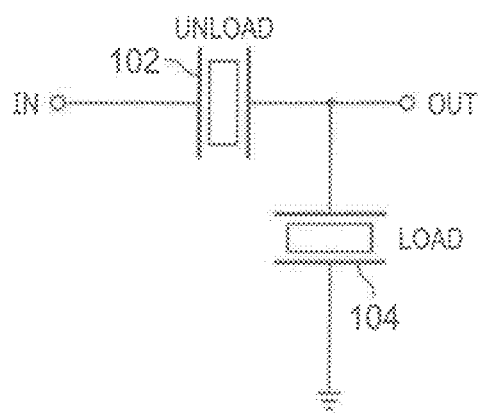
FIG. 1(a) is a schematic diagram of a one-stage bandpass ladder filter with one series and one shunt resonator according to the prior art.
Figure 1B:
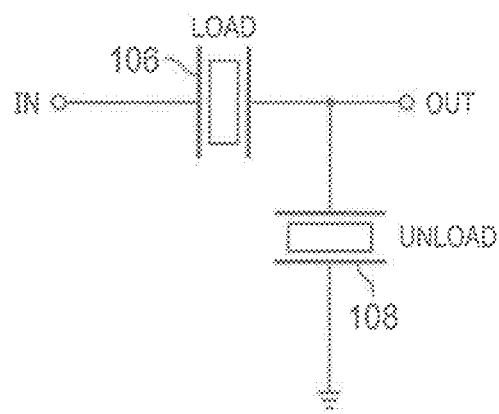
FIG. 1(b) is a schematic diagram of a one-stage bandstop ladder filter with one series and one shunt resonator according to the prior art.

FIGS. 1(a) and 1(b) are example topologies of a 1-stage ladder filter with one series and one shunt resonator. FIG. 1(a) is a schematic diagram of a bandpass filter having a series resonator 102 coupled between an input node IN and an output node OUT, and a shunt resonator 104 coupled between the output node OUT and ground. FIG. 1(b) is a schematic diagram of a bandstop filter having a series resonator 106 coupled between an input node IN and an output node OUT, and a shunt resonator 108 coupled between the output node OUT and ground.

Figure 1C:
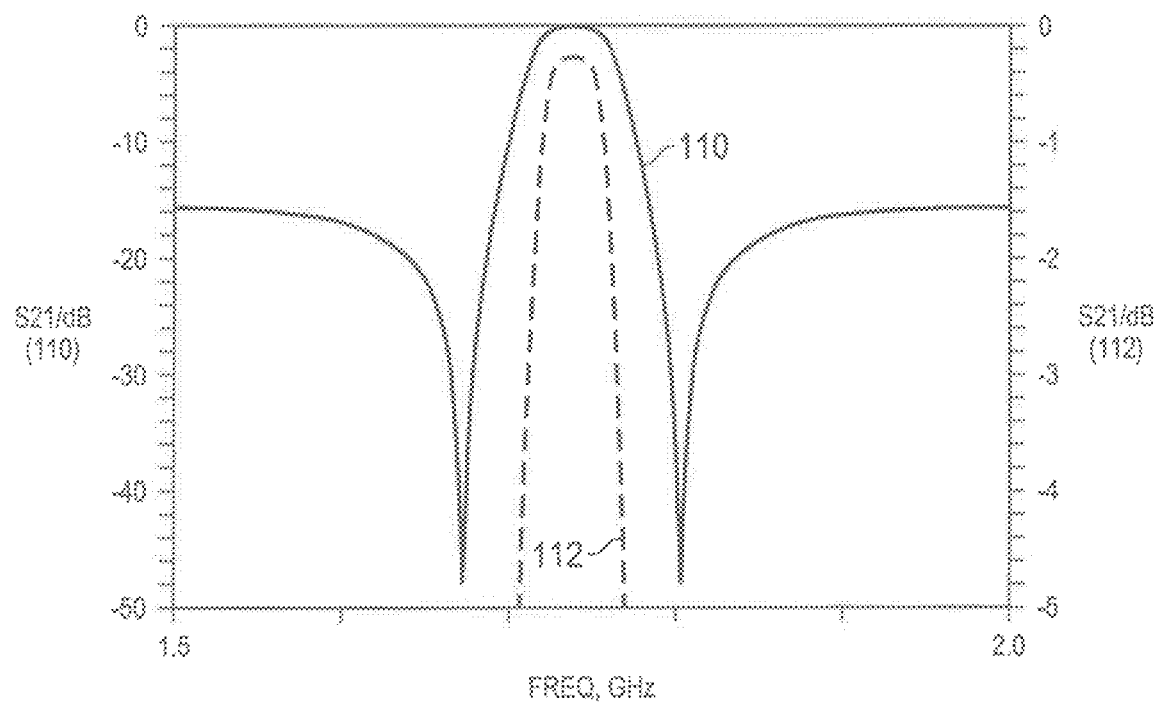
FIG. 1(c) is a graph of the frequency response of the filter shown in FIG. 1(a)
Figure 1D:
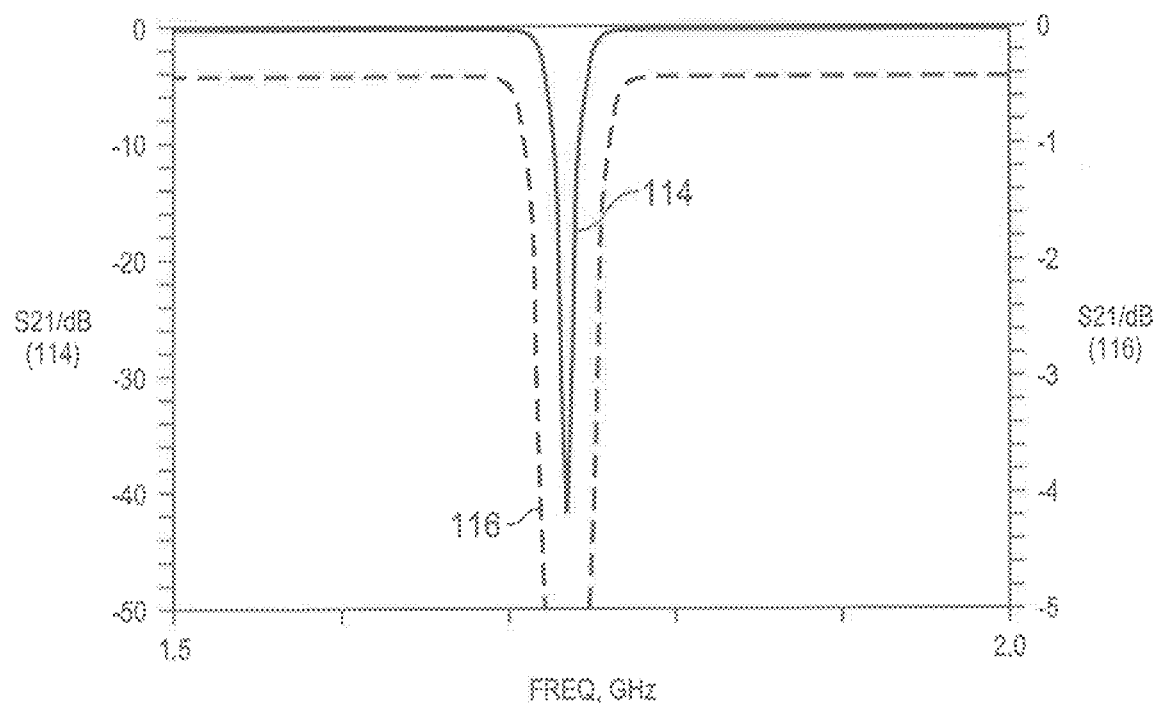
FIG. 1(d) is a graph of the frequency response of the filter shown in FIG. 1(b)

Typically, all series resonators have the same resonance frequencies, and all shunt resonators have the same resonance frequencies. Series and shunt resonators are, however, detuned in their resonance frequencies by a certain amount that roughly corresponds to the resonator's bandwidth. In the band-pass case of FIG. 1(a) the resonance frequencies of the shunt resonators 104 (Load) are lower than those of the series resonators 102 (Unload). In the band-stop case of FIG. 1(b) the resonance frequencies of the shunt resonators 108 (Unload) are higher than those of the series resonators 106 (Load). Note that the detuning is realized by adding an acoustic layer to the filter stack as will be described in further detail below. FIG. 1(c) shows the frequency response of the bandpass filter wherein response curve no shows a typical bandpass response with reference to the left-hand axis/scale/ticmarks, and response curve 112 shows the same curve with reference to the right-hand scale/ticmarks, e.g. in higher magnification/detail. FIG. 1(d) shows the frequency response of the bandstop filter wherein response curve 114 shows a typical bandstop response with reference to the left-hand axis/scale/ticmarks, and response curve 116 shows the same curve with reference to the right-hand axis/scale/ticmarks, e.g. in higher magnification/detail.

Figure 2A:
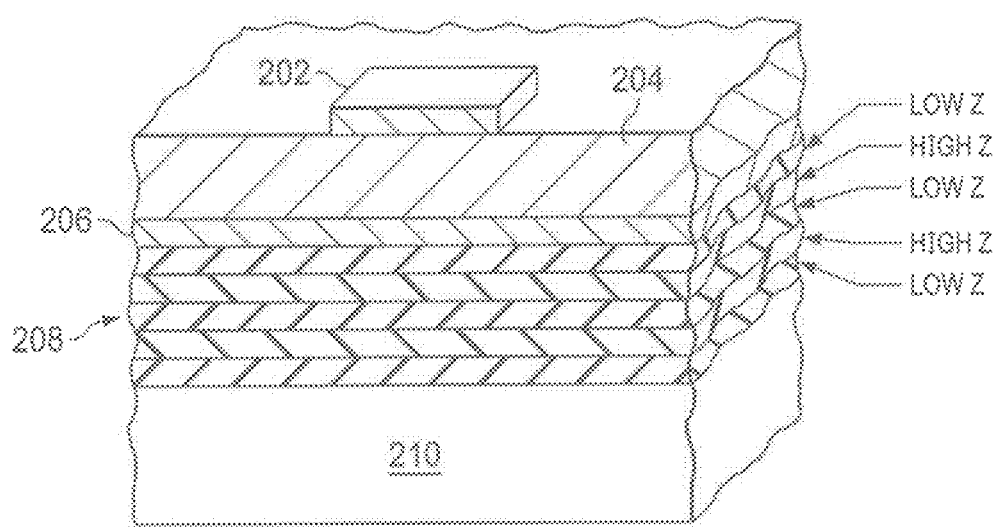
FIG. 2(a) is a cross-sectional view of a Bulk Acoustic Wave ("BAW") resonator according to the prior art.
Figure 2B:
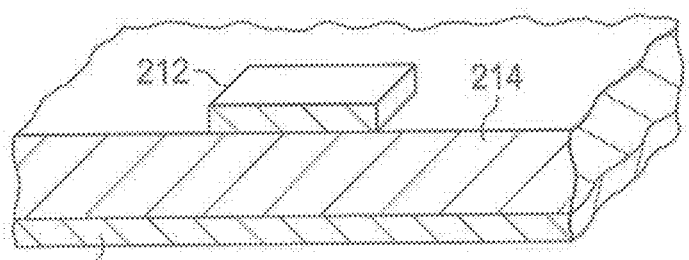
FIG. 2(b) is a cross-sectional view of a Film Bulk Acoustic Resonator ("FBAR") according to the prior art.

A simple bulk acoustic wave resonator is the Solidly Mounted Resonator ("SMR") shown in FIG. 2(a). The SMR resonator includes a bottom electrode 206, a piezoelectric layer 204, and a top electrode 202. Located between the resonator and the substrate 210, a so-called acoustic mirror 208 keeps the acoustic energy inside the resonator and includes a plurality of alternating high and low acoustic impedance layers. Another resonator configuration is the Film Bulk Acoustic Resonator ("FBAR") having only a top electrode, a piezoelectric layer 214 and a bottom electrode 216 without an acoustic mirror as is shown in FIG. 2(b). The FBAR resonator is often acoustically isolated from the substrate by a cavity located below the bottom electrode 216. Alternatively, the FBAR may be placed on a very thin supporting membrane below the bottom electrode (not shown).

In FIG. 2(a) each individual layer in acoustic mirror 208 may feature a thickness of approximately lambda/4, for example, where lambda denotes the acoustic wavelength of the longitudinal wave within the layer. Note that the wavelength lambda depends on the layer material. The acoustic mirror acoustically decouples the resonator from the supporting substrate as previously discussed. The resonance frequencies of such a BAW resonator depend on the thicknesses of all layers, where the piezoelectric layer 204 thickness is of the greatest influence, followed by the electrode 202 and 206 thicknesses. Frequency adjustments for an individual resonator of a BAW filter can be achieved by modifying one or more layers of that resonator's layer stack (i.e. by applying a lithography step and selectively etching a layer thickness away from one (or more) individual resonators. However, the resonance frequencies of such a typical BAW resonator are fixed by the overall layer structures and material selection/combination. The same holds true if the resonator is built on a membrane (or as a membrane) for means of acoustic decoupling to the substrate. Such conventional resonators can be trimmed (frequency adjusted) be means of e.g. thinning individual layers during processing, for example. The resonators can be tuned by electrical means (circuitry) within a small frequency range only to maintain the required resonator performance.

Figure 3A:
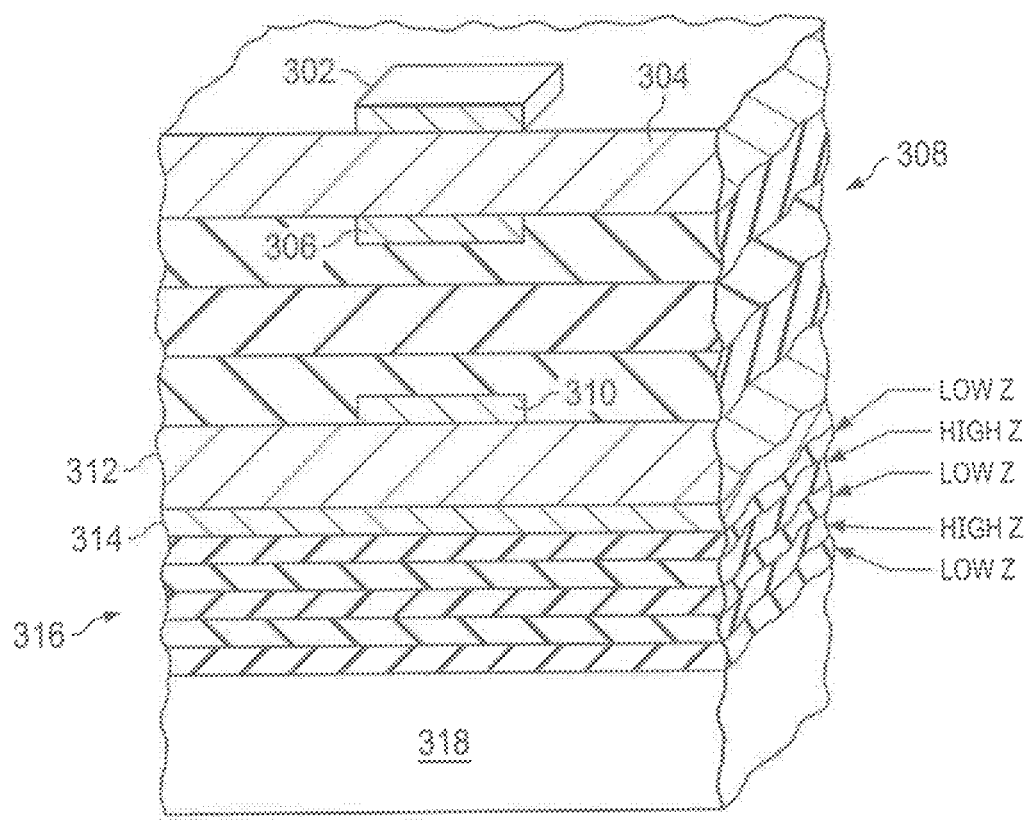
FIG. 3(a) is a cross-sectional view of a Coupled Resonator Filter ("CRF") with three coupling layers according to an embodiment.

A further developed BAW device is the acoustically coupled BAW resonator as is shown in FIGS. 3(a) and (b). Here, two resonators are directly coupled through one (FIG. 3(b)) or three (FIG. 3(a)) or more acoustic layers.

FIG. 3(a) shows an acoustically coupled resonator filter including a top electrode 302 of a top resonator, a piezoelectric layer 304 of the top resonator, a bottom electrode 306 of the top resonator, a stack of acoustic coupling layers 308, a top electrode 310 of a bottom resonator, a piezoelectric layer 312 of the bottom resonator, a bottom electrode 314 of the bottom resonator, an acoustic mirror 316, and a substrate 318.

Similar to the acoustic mirror 208 described above, the sequence of layers in acoustic coupling layer 308 has alternating low and high acoustic impedances. The BAW topology shown in FIG. 3(a) described above (and in FIG. 3(b) described below) is also known as a Coupled Resonator Filter ("CRF").

Figure 3B:
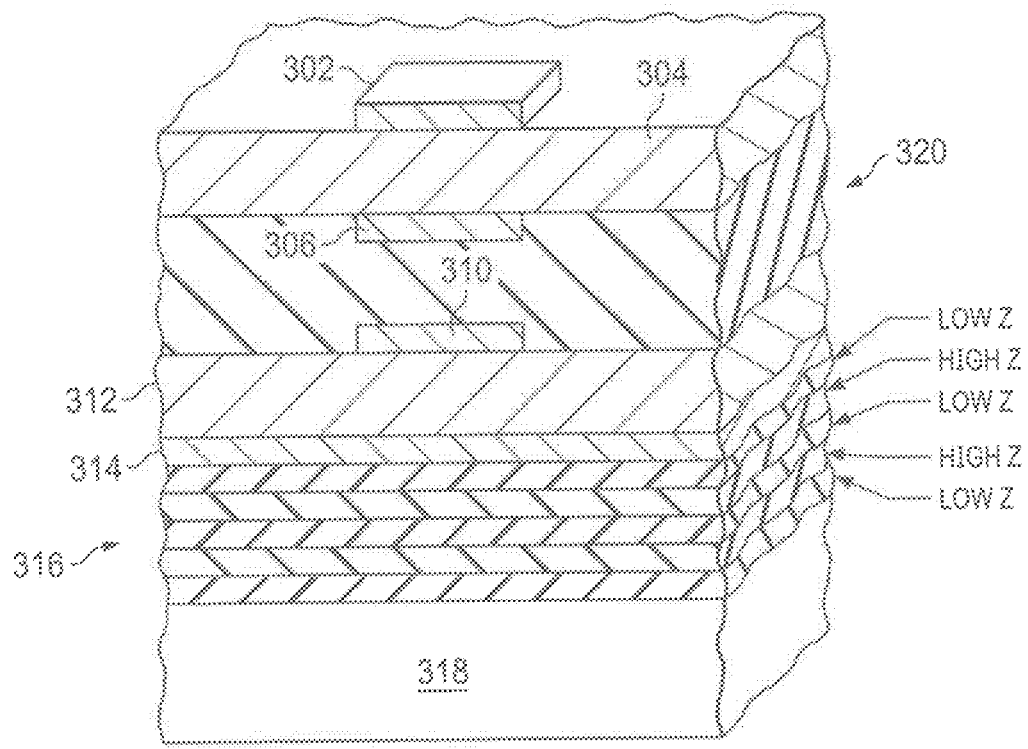
FIG. 3(b) is a cross-sectional view of a CRF with one coupling layer according to an embodiment.

FIG. 3(b) shows an acoustically coupled resonator filter including all of the same layers as was previously discussed with the acoustically coupled resonator filter of FIG. 3(a) except that acoustic coupling layer 320 replaces the stack of acoustic coupling layers 308 previously shown. Acoustic coupling layer 308 includes three separate layers with alternating acoustic impedances, whereas acoustic coupling layer 320 includes a single acoustic impedance layer.

Figure 3C:
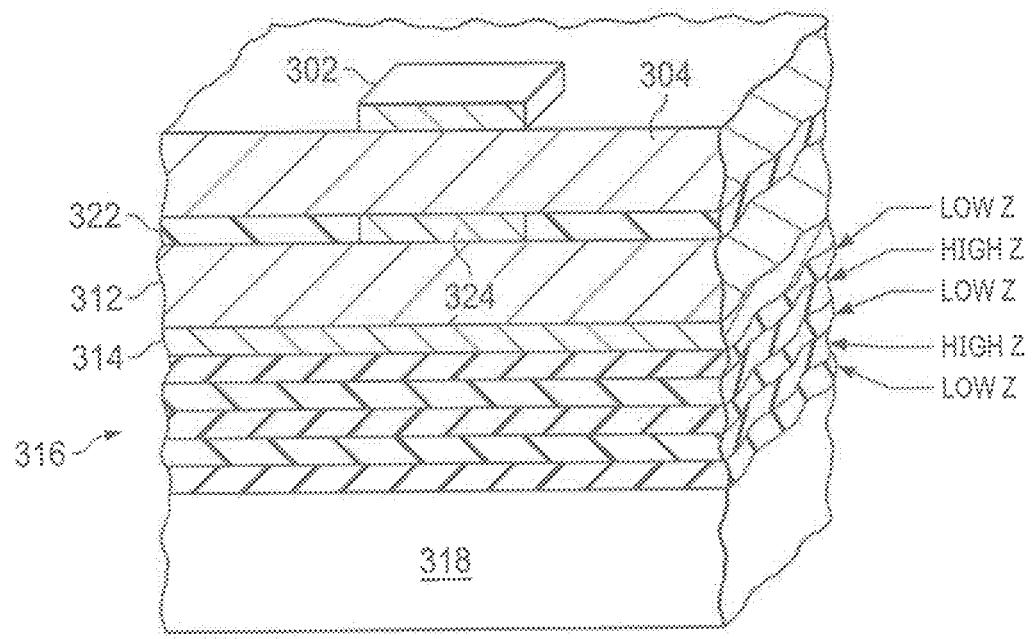
FIG. 3(c) is a cross-sectional view of a Stacked Crystal Filter ("SCF") according to an embodiment.

An acoustic coupling of two resonators in a filter without additional acoustic layers and thus essentially a stack of two FBARs is called a Stacked Crystal Filter ("SCF") as is shown see FIG. 3(c). By the strength of the coupling between the two resonators, which is controlled by the number and thickness of the coupling layers, the fundamental resonance mode is divided into two separate modes. Thus, the filter shown in FIG. 3(c) is essentially as previously described using the same patent drawing numerals, except that layer 322 directly couples the top and bottom piezoelectric layers and includes a middle electrode portion 324 as shown. This middle electrode portion 324 is a joint electrode of both resonators.

A general and important characteristic of all BAW resonators is the capacitor with a capacitance value of Co formed by the piezoelectric layer sandwiched between the two top and bottom electrodes previously described. Thus, a BAW resonator acts like a capacitor in frequency ranges apart from the frequencies ranges associated with or near the resonance frequency.

Embodiments described herein are acoustic coupled topologies and external inductors/capacitors for BAW resonator notch filters that allow building wide bandwidth, highly-selective RF notch filters. Such filters can pave the way to advanced RF frontend topologies with a significantly reduced number of components and form factor, saving cost. Compared to the state-of-the-art notch filter solutions referred to above, filter topologies described below according to embodiments offer a very small form factor, which makes them attractive for future mobile RF front end applications.

Thus, the usage of the SCF/CRF capacitances as a substitution for the capacitors in an all-pass lumped-element filter topology to form notches in the respective all pass response is described in further detail below according to embodiments. Using embodiment methods, a notch/bandpass filter including resonator structures can be created from an all pass filter topology.

All-pass networks are usually used as passive lumped-element delays or as phase correctors for filter networks due to their constant resistance and no attenuation at all frequencies. According to embodiments the all-pass lumped-element network topologies are used as a basic element and the capacitive key elements (Co) of the all-pass lumped element network are replaced by the natural (static) capacitances of the BAW resonators as will be described in further detail below. Due to the overall capacitive behavior of BAW resonators, the all-pass characteristic remains and the notch or notches occur only at the resonance frequencies of the BAW device. All-pass networks can include the bridged-T All-Pass and a quasi-Pi-All-Pass topology as are known in the art and described in further detail below. For the second network the term "Quasi" is used, since the insertion loss increases for higher frequencies but are insignificantly small for the intended operating frequency range. In the following description, fixed filter elements and tunable filter elements are distinguished and described.

Fixed and tunable bridged-T all-pass based notch filters are described below with respect to FIGS. 4(a)-(e) and FIGS. 5(a)-(b) (fixed) and FIGS. 6(a)-(e) (tunable).

Figure 4A:
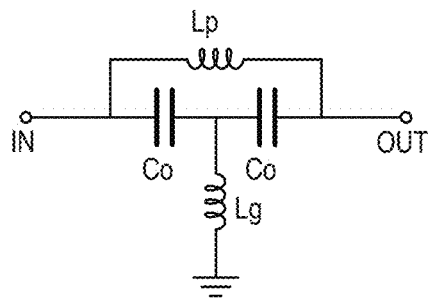
FIG. 4(a) is a schematic diagram of an all-pass filter according to the prior art.
Figure 4B:
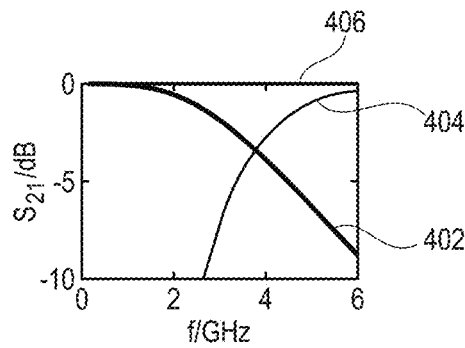
FIG. 4(b) is a graph of the frequency response of the filter shown in FIG. 4(a)
Figure 4C:
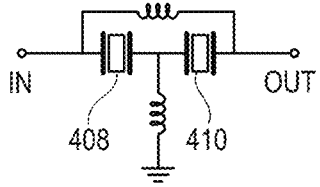
FIGS. 4(c), (d), and (e) are schematic diagrams of notch filters according to embodiments.
Figure 4D:
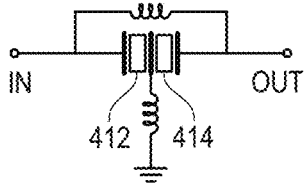
Figure 4E:
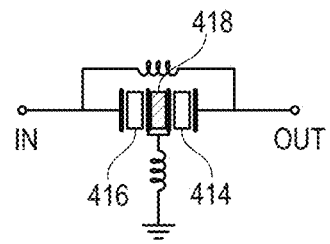

The bridged-T all-pass based notch filters are realized by using a simple lumped element all-pass-filter as is shown in FIG. 4(a). The all-pass filter includes two serially-coupled capacitors Co coupled between an input node IN and an output node OUT, a shunt inductor Lg coupled between an intermediate node to ground, and a parallel inductor Lp coupled between the input node IN and the output node OUT. The filter response is depicted in FIG. 4(b). FIG. 4(b) shows a passband response 406 over a wide frequency range, i.e. the frequency response of an all-pass. For low frequencies, the filter transmission is essentially provided by the inductor Lp as shown in curve 402, whereas the capacitors are responsible for the transmission at higher frequencies, as shown in curve 404. The overall transmission 406 of the all pass filter results from the combination of the transmissions 402 and 404. To form the desired notch filter, the capacitors Co are replaced by the natural (static) capacitances of either two individual BAW resonators 408 and 410, as is shown in FIG. 4(c), or by the static capacitances of an acoustically coupled BAW resonator device 412/414, which can be for example an SCF, as is shown in FIG. 4(d), or a CRF 416/418/420, as is shown in FIG. 4(e). In FIGS. 4(c), (d), and (e) 408, 410, 412, 414, 416, and 420 are individual resonators, or directly or acoustically coupled resonators, and 418 is an acoustic coupling layer.

In FIGS. 4(c), (d), and (e), two BAW resonators are used, but in FIG. 4(c) the two BAW resonators 408 and 410 are not acoustically coupled (but placed side-by-side as individual electrically coupled devices), whereas in FIGS. 4(d) and (e) the BAW resonators 412/414 and 416/420 are acoustically coupled directly or through an acoustic coupling and are stacked one-over-the-other in one single device (which can save device area).

Figure 5A:
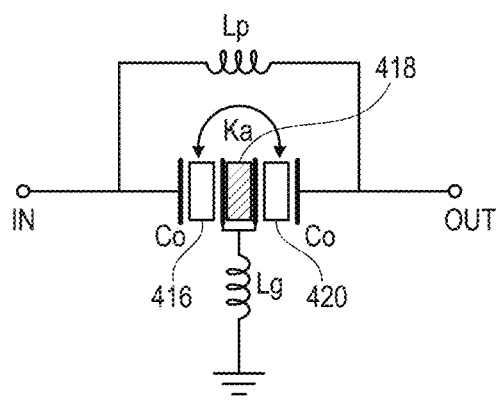
FIG. 5(a) is a schematic diagram of a notch filter according to an embodiment.
Figure 5B:
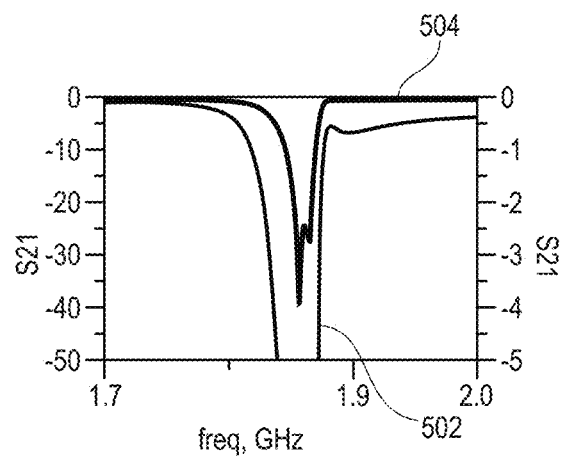
FIG. 5(b) is a graph of the frequency response of the filter shown in FIG. 5(a)

The frequency response for the all-pass network with SCF/CRF is depicted in FIG. 5(b). Now, the frequency response exhibits a band-stop characteristic inside of the all-pass response. It is important to note that the number of notches inside the stop-band depends on the acoustically coupled resonator that is used. In the case of a simple SCF structure there is only one notch since the two resonators are coupled directly. For a CRF, with one or three coupling layers, two notches can be observed (mode degeneration). The distance between the two notches is controlled by the strength of acoustic coupling "ka" between the resonators of the CRF structure.

FIG. 5(a) shows a schematic of a notch filter using an acoustically coupled resonator (as also shown in FIG. 4(e), for example). The notch filter includes resonators 416 and 420 acoustically coupled through acoustic coupling layer 418, as well as inductors Lp and Lg previously described. The capacitances Co of the all-pass topology are replaced by an acoustically coupled resonator 416/418/420 to form transmission zeros in the pass band. The acoustically coupled resonator 416/418/420 could be a stacked crystal filter ("SCF") or a coupled resonator filter ("CRF") with one coupling layer or three coupling layers for example to form the acoustic coupling factor "ka". A notch filter response 504 is shown using a CRF with three coupling layers, which forms two notches as shown. The inductors Lg and Lp, as well as the natural capacitance Co of the coupled BAW resonators, can be used to adjust the notch filter response. For example, the steepness of the passband to stopband transition can be changed as is shown in response curve 502.

Figure 6A:
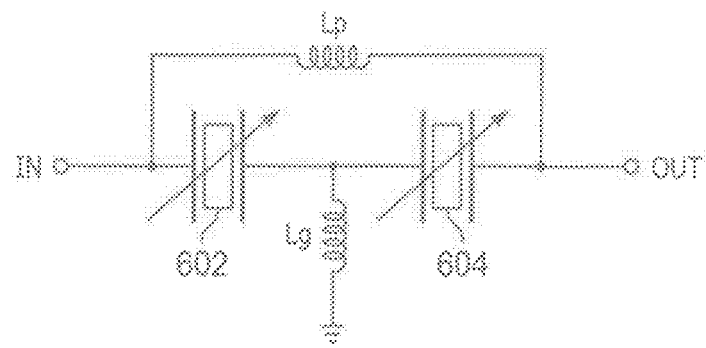
FIGS. 6(a), (b), (c), and (d) are schematic diagrams of tunable notch filters according to embodiments.

Filter embodiments described herein significantly reduce the complexity of RF frontends for e.g. 4G LTE standards through the use of tunable filters in combination with adapted filter topologies. Thus, a tunable version of the previously described fixed notch filter is shown in FIGS. 6(a), (b), (c), and (d). The resonators of the fixed notch filter topologies shown in FIGS. 4(c), (d), and (e) are replaced by tunable resonators. Tunable resonators require more complex resonator devices and/or additional electric tuning components. In contrast to the fixed version of the notch filter, the number of BAW devices is now doubled, see FIGS. 6(b) and (c).

Figure 6C:
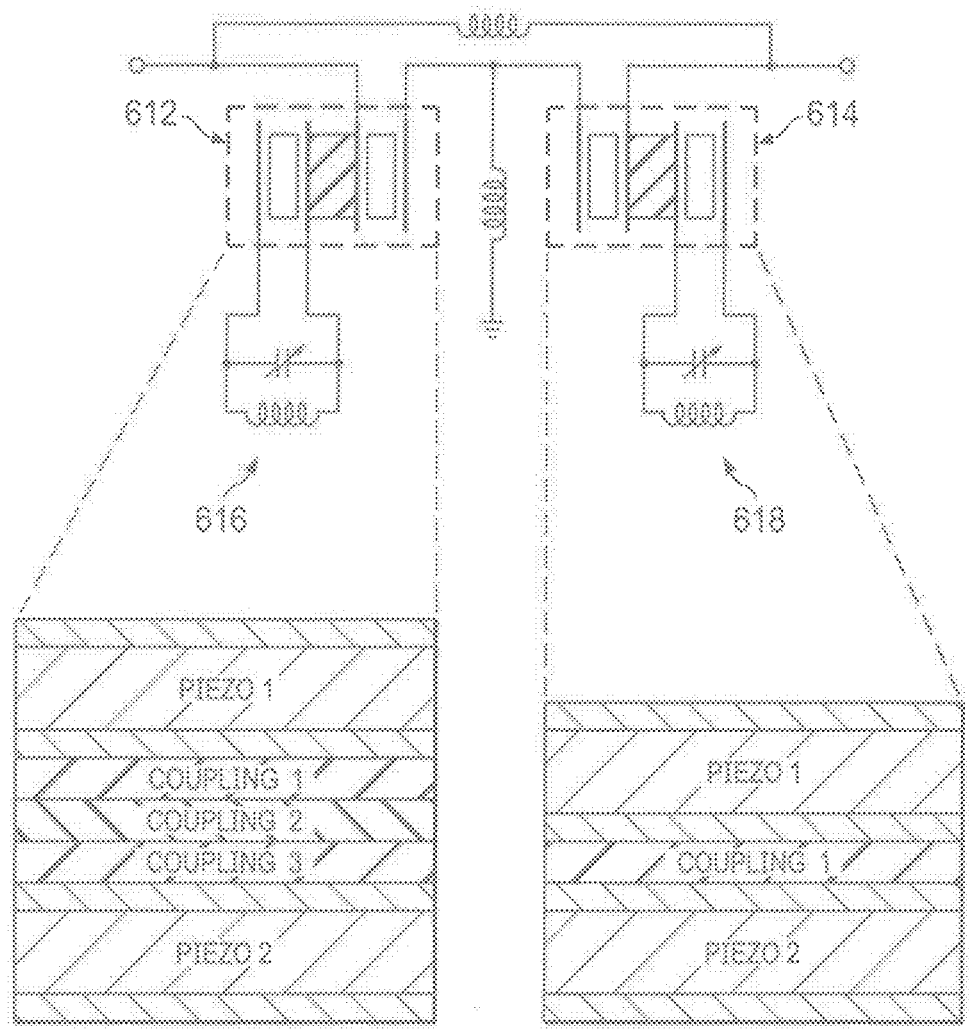
FIG. 6(e) is a graph of the frequency response of the filters shown in FIGS. 6(a), (b), (c), and (d)

FIG. 6(a) shows a tunable bridged-T all-pass based notch filter using two electrically coupled resonators 602 and 604, as well as input and output nodes, and inductors as previously discussed. In FIGS. (b) and (c) the capacitances of the all-pass topology are replaced by acoustically coupled and tunable resonators to form tunable transmission zeros in the pass band. The acoustically coupled resonators could be implemented using an SCF implementation (FIG. 6(b)) or a CRF implementation with one coupling layer or three coupling layers (FIG. 6(c)) to form the acoustic coupling factor "ka". In FIG. 6(d) a simple tunable FBAR or SMR is used. For tuning, capacitors and inductors in series or parallel to the resonators are used.

Figure 6B:
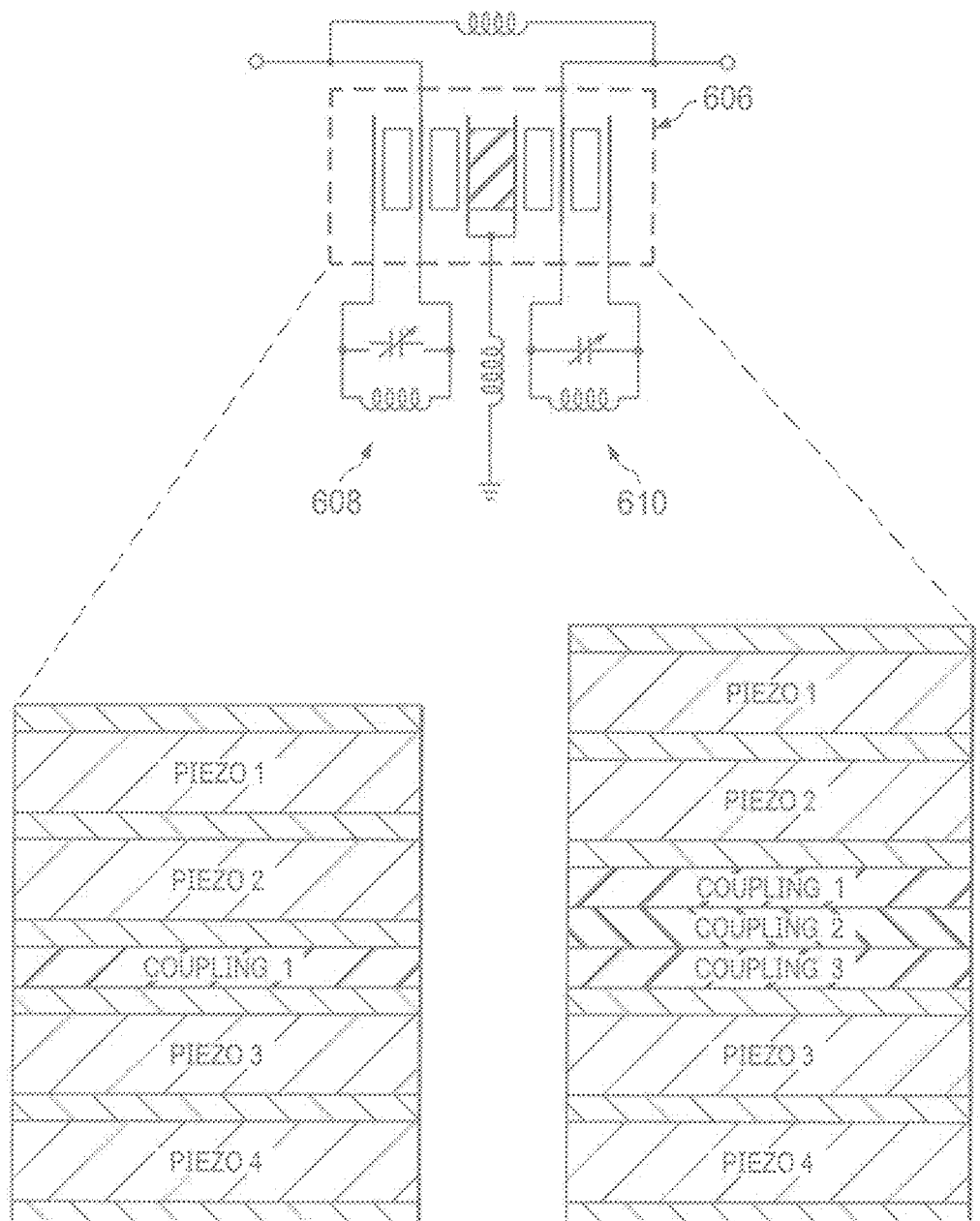
Figure 6D:
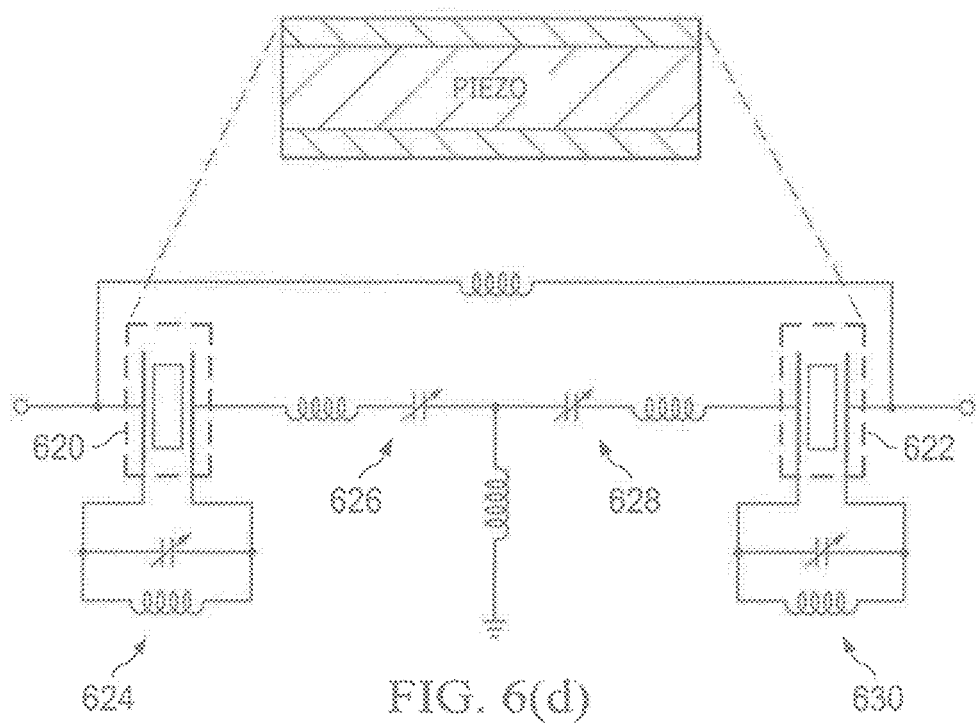

The resonator structure 606 shown in FIG. 6(b) only uses one acoustically coupled BAW device, which can be considered as two acoustically Coupled SCF ("CSCF"), for example. The corresponding layer stack of such a CSCF device is also shown and includes e.g. four piezoelectric layers Piezo 1, Piezo 2, Piezo 3, Piezo 4, six electrodes (above and below the piezoelectric layers), and a (at least) one acoustical coupling layer Coupling 1 (which may be electrically isolating or conducting), as shown in FIG. 6(b). The acoustical coupling layer can include three layers shown as Coupling 1, Coupling 2, and Coupling 3 comprises alternating high and low acoustic impedance layers as was previously discussed. Optionally, additional electrodes and coupling layers may be used in resonator structure 606. The minimum number of electrodes is five if the coupling layer is conducting and serves as a joint electrode between the two SCF-type structures. The number of electrodes shown is six with three electrodes for each SCF-type structure. Another option/possibility is to split the inner electrode of each SCF into two electrodes that are electrically isolated from each other in order to galvanically decouple the electrical tuning circuits from the RF signal path. This option results in a total number of eight electrodes in the layer stack, which then comprises two acoustically coupled CRF-type structures. This option is not shown. Note that the topology shown in FIG. 6(c) uses two CRFs that are individual devices without acoustical coupling. Two tuning circuits 608 and 610 are shown, each associated with one of the resonators in resonator structure 606. Each tuning circuit includes a parallel-connected inductor and varactor (tunable capacitor).

FIG. 6(c) shows a tunable notch filter corresponding to the general topology shown in FIG. 6(a). Two separate tunable BAW resonator devices are used, 612 and 614, each including two acoustically coupled BAW resonators.. The corresponding layer stacks, also shown in FIG. 6(c), including two piezoelectric layers (Piezo 1 and Piezo 2), four electrically isolated electrodes (above and below the piezoelectric layers), and (at least) one acoustical coupling layer (Coupling 1 or Coupling 1/Coupling 2/Coupling 3) that is electrically isolating). In each tunable resonator, one resonator (e.g. Piezo 1) is used in the signal path of the notch filter, whereas the respective other resonator (e.g. Piezo 2) is used as a component of a tuning circuit 616 or 618. The tuning circuits 616 and 618 include additional electrical components like tunable/switchable capacitors and inductors, for example, as shown. Thus, in order to realize such tunable resonators, also capacitors and inductors are used, but the number of needed passive electrical tuning elements is reduced by a factor of two compared to the single FBAR/SMR tuning as shown in FIG. 6(d).

It is also possible to realize the filters shown in FIGS. 6(b) and 6(c) using acoustically coupled (tunable) resonators as SCF-like structures, i.e. including two piezoelectric layers and three electrodes only (e.g. with the middle electrode shared by both resonators as was previously discussed).

FIG. 6(d) shows a tunable notch filter implementation using only two single resonators 620 and 622 that are not acoustically coupled. Resonators 620 and 622 are only electrically coupled through tuning circuits 626 and 628. Resonator 620 is also coupled to tuning circuit 624, and resonator 622 is also coupled to tuning circuit 630. Each of the tuning circuits can be realized as the parallel combination of an inductor and a varactor as shown. The physical implementation of a simple resonator is a single Piezo piezoelectric layer, and two electrodes above and below the piezoelectric layer as shown.

Figure 6E:
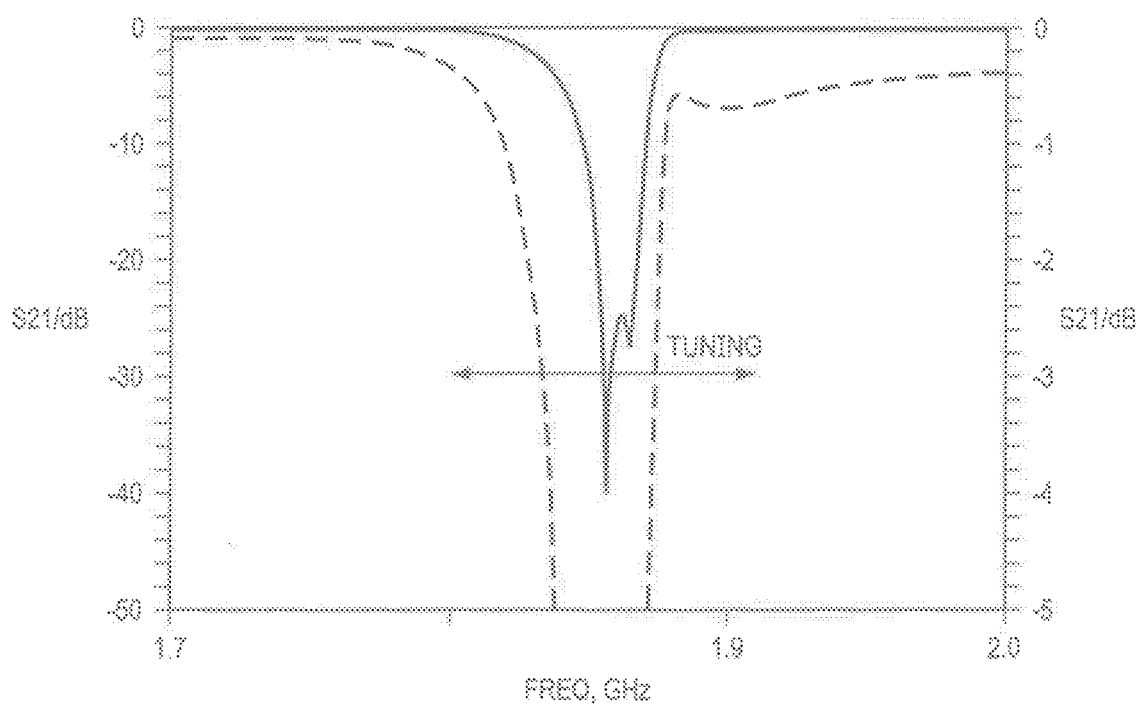

The number of notches (transmission zeroes) within the bandstop region of the frequency response again depends on the BAW resonator type used. The filters shown in FIGS. 6(c) and (d) in result in one notch because they use two acoustically uncoupled resonators in the series path. In contrast, the CSCF-based approach of FIG. 6(b) results in two notches within the bandstop region due to the acoustic coupling in the series path. In an embodiment, two notches for the filters of FIGS. 6(c) and (d) is possible if the separated resonators are designed to implement two different frequencies. If this is the case, then two notches will appear. The filter response shown in FIG. 6(e) is substantially the same as shown in FIG. 5(b) are previously described. Note however, the presence of two tuning arrows in the filter response, noting that the depicted notches can be moved to a lower or higher frequency by the action of the tuning circuits.

Figure 7A:
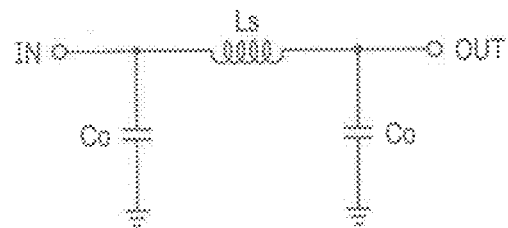
FIG. 7(a) is a schematic diagram of a quasi-pi all-pass filter according to the prior art.

Quasi-Pi All-Pass based notch filters are described below with reference to drawing FIGS. 7(a) and (b), FIGS. 8(a) and (b), and FIGS. 9(a), (b), and (c).

Figure 7B:
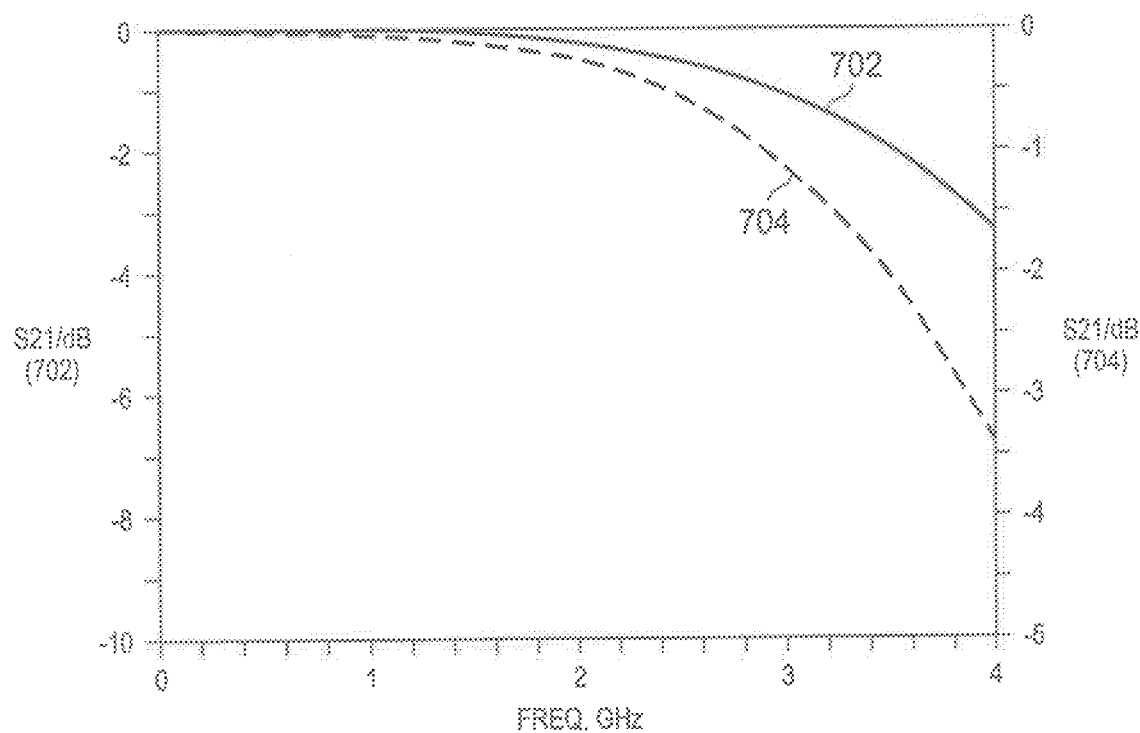
FIG. 7(b) is a graph of the frequency response of the filter of FIG. 7(a)

The Quasi-Pi All-Pass based fixed notch filters are realized by using a bridged-T all-pass topology and replace the shunt inductor by a short to ground (compare with the filter shown in FIG. 4(a)). Then, only the two capacitors Co and a series inductor Ls remain as is shown in FIG. 7(a). The response is depicted in FIG. 7(b). The response graph shows the passband over a wide frequency range with two representative transmission response curves 702 and 704 (curve 702 is with reference to the left axis, whereas curve 704 shows the same data with reference to the right axis, showing more detail). To form the desired notch filter, the capacitors Co are again replaced by the natural static capacitances of an acoustically coupled BAW resonator that can be a SCF or CRF in embodiments.

Figure 8A:
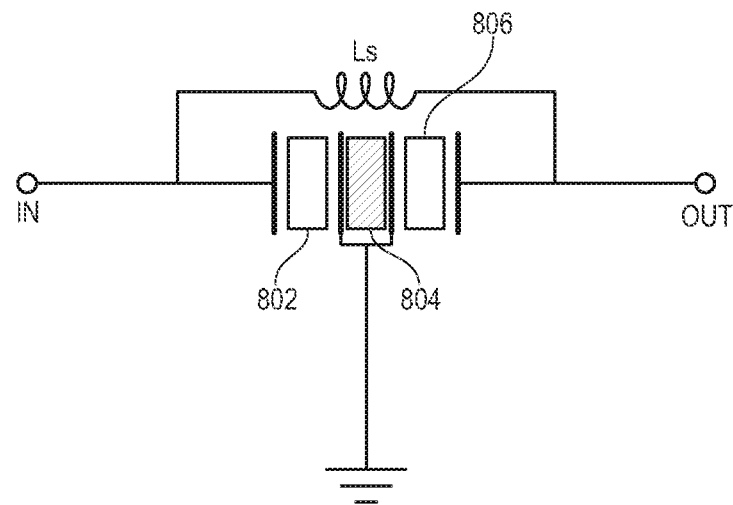
FIG. 8(a) is a schematic diagram of a notch filter according to an embodiment.
Figure 8B:
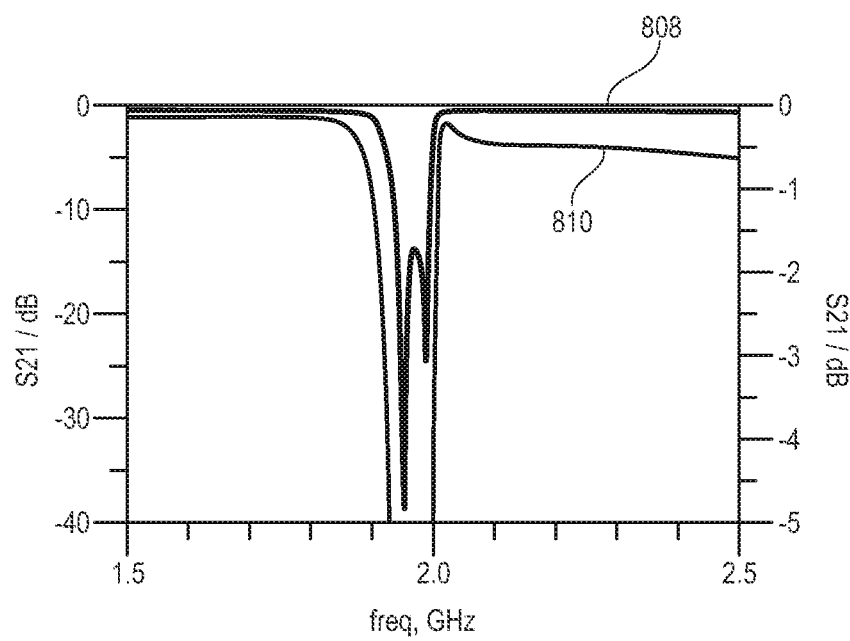
FIG. 8(b) is a graph of the frequency response of the filter of FIG. 8(a)

A notch (bandstop) filter using an acoustically coupled resonator is shown in FIG. 8(a). The capacitances of the all-pass topology are replaced by a acoustically coupled resonator structure 802/804/806 to from transmission zeros in the pass band. The acoustically coupled resonator structure could be a stacked crystal filter ("SCF") or a coupled resonator filter ("CRF") with one coupling layer or three coupling layers to form the acoustic coupling factor "ka" as previously described. FIG. 8(b) shows the notch (bandstop) filter response using a CRF with three coupling layers, that form two notches (transmission zeroes) in response curve 808 (with reference to the left axis) or curve 810 (with reference to the right axis, showing more detail). The inductor Ls as well as the natural capacitance Co of the coupled BAW resonators can be used to adjust the notch filter response. For example, the steepness of the passband to stopband transition can be changed.

As previously described, the number of notches (transmission zeroes) inside the stop-band depends on the used acoustical coupled resonator. In the case of a simple SCF structure there is only one notch since the two resonators are coupled directly. For a CRF, with one or three coupling layers, two notches can be observed (mode degeneration). The distance between the two notches is controlled by the strength of acoustic coupling "ka" between the resonators of the CRF structure.

FIGS. 8(c), (d), (e), (f), and (g) show all-pass based notch filters using two CRF or two SCF type resonator structures. All filters include an input node IN, an output node OUT, inductors Lp and Lg, and two resonator structures. Inductor Lg is coupled between one or more intermediate electrodes and a bottom electrode of the resonators are coupled together in filters 812, 816, and 820 shown in FIGS. 8(c), 8(d), and 8(e). Filters 812 and 816 comprise CRF resonator structures, and filter 820 comprises an SCF resonator structure. Inductor Lg is coupled between the bottom electrodes of the resonator structures and ground in filters 824 and 826 shown in FIGS. 8(f) and 8(g). Filter 824 comprises a CRF resonator structure, and filter 826 comprises an SCF resonator structure. Response graph 814 corresponds to filter 812, response graph 818 corresponds to filter 816, response graph 822 corresponds to filter 820, and response graph 828 corresponds to filters 824 and 826. The shunt inductors Lg can be shorted to achieve better band-stop characteristics in some cases.

FIG. 9(a) shows a tunable quasi Pi all-pass based notch filter using two tunable resonators 902 and 904 coupled together by inductor Ls, which in turn is coupled between the input node IN and the output node OUT. FIG. 9(b) shows a tunable quasi Pi based all-pass notch filter using two separate acoustically coupled resonators (CRF-type). In FIG. 9(b) the two capacitances of the all-pass topology are replaced by two acoustically coupled and tunable resonators 906/908/910 and 914/916/918 to form tunable transmission zeros in the frequency response. A tuning circuit 912 is coupled to resonator 910 and a tuning circuit 920 is coupled to resonator 918. The acoustically coupled resonators could be implemented as a stacked crystal filter (SCF) or a coupled resonator filter (CRF) with one coupling layer or three coupling layers to form the acoustic coupling factor "ka". Each acoustically coupled resonator device offers a resonator that is included in the signal path, 906 and 914, and a second resonator which is part of an electrical tuning circuit (910 and 918) as shown. In FIG. 9(c) simple FBAR or SMR resonators 922 and 928 are used with electrical frequency tuning provided by tuning circuits 924, 926, 930, and 932. For the tuning circuits, capacitors and inductors in series or parallel to the resonators are used.

FIGS. 10(a), (b), and (c) show fixed and tunable quasi Ladder based notch filters using coupled resonators. FIG. 10(a) in an upper portion shows a fixed notch filter comprising a first resonator structure 1002 coupled between an input node IN and an output node OUT; a second resonator structure 1004 coupled between the input node and ground;

and a third resonator structure 1006 coupled between the output node and ground. FIG. 10(*a*) in an lower portion shows a tunable notch filter comprising a first tunable resonator structure 1008 between the input node IN and the output node OUT; a second tunable resonator structure 1010 coupled between the input node and ground; and a third resonator structure 1012 coupled between the output node and ground. FIG. 10(*b*) shows an acoustically coupled resonator structure embodiment, wherein the first resonator structure comprises an acoustically coupled resonator structure 1014 and tuning circuit 1016, the second resonator structure comprises an acoustically coupled resonator structure 1018 and tuning circuit 1020, and the third resonator structure comprises an acoustically coupled resonator structure 1022 and tuning circuit 1024. FIG. 10(*c*) shows a single resonator embodiment, wherein the first resonator structure comprises a single resonator 1038 and tuning circuits 1040 and 1042, the second resonator structure comprises a single resonator 1026 and tuning circuits 1028 and 1030, and the third resonator structure comprises a single resonator 1032 and tuning circuits 1034 and 1036.

FIGS. 11(*a*), (*b*), and (*c*) show fixed and tunable quasi Lattice based notch filters using a coupled resonators. An upper portion of FIG. 11(*a*) shows a fixed notch filter comprising a first resonator structure 1102 coupled between a first input node and a first output node; a second resonator structure 1108 coupled between a second input node and a second output node; a third resonator structure 1104 coupled between the first input node and the second output node; and a fourth resonator structure 1106 coupled between the second input node and the first output node. An lower portion of FIG. 11(*a*) shows a tunable notch filter comprising a first resonator structure 1110 coupled between a first input node and a first output node; a second resonator structure 1116 coupled between a second input node and a second output node; a third resonator structure 1112 coupled between the first input node and the second output node; and a fourth resonator structure 1114 coupled between the second input node and the first output node. FIG. 11(*b*) shows the equivalent acoustically coupled resonator embodiment including tunable acoustically coupled resonators 1118, 1120, 1122, and 1124. FIG. 11(*c*) shows the equivalent single resonator embodiment including tunable single resonator structures 1126, 1128, 1130, and 1132.

FIGS. 12(*a*), (*b*), and (*c*) show fixed and tunable all-pass Triplet structure configured as a notch filter. FIG. 12(*a*) in an upper portion shows a fixed filter comprising a first inductor L1 coupled between an input node and an output node; a second inductor L2 coupled between the input node and an intermediate node; a third inductor L3 coupled between the output node and the intermediate node; a first resonator structure 1204 coupled between the input node and ground; a second resonator structure 1206 coupled between the output node and ground; and a third resonator structure 1202 coupled between the intermediate node and the second output node. FIG. 12(*a*) in a lower portion shows a tunable filter comprising a first inductor L1 coupled between an input node and an output node; a second inductor L2 coupled between the input node and an intermediate node; a third inductor L3 coupled between the output node and the intermediate node; a first tunable resonator structure 1210 coupled between the input node and ground; a second tunable resonator structure 1212 coupled between the output node and ground; and a third tunable resonator structure 1208 coupled between the intermediate node and the second output node. An acoustically coupled resonator embodiment is shown in FIG. 12(*b*) including acoustically coupled tunable resonator structures 1214, 1216, and 1218. A single resonator embodiment is shown in FIG. 12(*c*) including tunable single resonator structures 1220, 1222, and 1224.

FIGS. 13(*a*) and (*b*) show that the previously described notch/bandstop filter (NPF) elements can be cascaded to meet system specifications. The NPF elements can be the same or different selected from the previously described filter embodiments. FIG. 13(*a*) shows two bandstop filters 1302 and 1304, whereas FIG. 13(*b*) shows "N" bandstop filters 1302, 1304, through 1306.

FIGS. 14(*a*) and (*b*) show the combination of a bandstop filter (BSF) with a bandpass filter (BPF) to improve selectivity or filter skirt steepness. Again, all combinations of notch/band-stop filters can be used, e.g. tunable notch filter element with fixed filter or tunable notch/band-stop and tunable band-pass filter. An upper portion of FIG. 14(*a*) shows a BSF element 1402 in series with a BPF filter 1404. A lower portion of FIG. 14(*a*) shows the BSF element 1402 replaced with an acoustically coupled resonator filter structure 1406 as has been previously described. FIG. 14(*b*) shows dashed portions of curves 1408 and 1410 showing the frequency response (S21) of a bandpass filter (BPF) example without the BSF element in series. Solid portions of curves 1408 and 1410 show the frequency response of the bandpass filter in combination with a bandstop filter (BSF) according to embodiments. Note that the two curves 1408 (dashed) and 1408 (solid) refer to the right |S21| axis (from 0 dB down to −100 dB), whereas the same data are shown in the two curves 1410 dashed and 1410 solid with reference to the right |S21| transmission axis (from 0 dB down to −5 dB only), giving more information/detail about the passband insertion loss. The BSF introduces two additional transmission zeroes, leading to a much steeper upper skirt (shown in the two solid curves 1408 and 1410, respectively) of the combined BSF/BPF bandpass filter as compared to the response without the BSF (shown in the two dashed curves 1408 and 141o, respectively).

Filter embodiments described herein realize small sized and tunable BAW notch filters by using acoustically coupled resonator filters. Filter embodiments described herein use an all-pass lumped element topology as a basic topology and replace the capacitive elements by the natural static capacitances of BAW resonators. Additionally interference is filtered out that could jeopardize wanted bands rather than designing narrowband bandpass filters for each wanted band and combination of narrowband filter arrays that are switched in for certain applications such as dedicated carrier aggregation applications. The interference filtering is accomplished using wideband RF filters followed by dedicated narrowband tunable band-stop filters as described above.

In another embodiment, acoustic coupled topologies and external inductors/capacitors for BAW (Bulk Acoustic Wave) resonators are described that allow building wide bandwidth RF band-pass filters. Such filters can pave the way to advanced RF frontend topologies with a significantly reduced number of components and form factor. Compared to the state-of-the-art (ladder or lattice) bandpass filter solutions mentioned above, the described topologies offer a very small form factor, that makes them very attractive for future mobile RF front end applications.

According to embodiments, band-pass topologies used fixed and tunable SCF/CRF resonator structures. By the series connection of CRF/SCF resonator structures, wide bandwidth and high out-of-band-rejection filters are obtained. The respective filter response can also be improved by adding parallel capacitances as is described in further detail below. A reconfigurable device is obtained by using tunable resonator elements, in embodiments. Furthermore, the use of SCF/CRF resonator structures (which are also referred to as SCR/CRR, i.e. Stacked Crystal Resonator/Coupled Resonators Resonator), are implemented in ladder topologies with smaller area consumption than conventional FBAR/SMR based ladder filters. Again, tunable resonators are used to make the filter reconfigurable, in embodiments.

SCF/CRF based bandpass filters are described below.

A Fixed Bandpass Filter can be implemented with a single CRF resonator structure. With the operation of a single CRF as a stand-alone filter, a passband characteristic can be obtained. However, the filter skirt shows very low steepness (see dashed frequency response curve 1508 in FIG. 15(b)) and should be higher for today's mobile communication standards to ensure selectivity.

The single CRF resonator structure implementation can be improved using a Parallel Feedback Capacitance according to embodiments. By adding a capacitance 1502 parallel to a single CRF 1504 (see FIG. 15(a)) a transmission zero (TZ) 1510 is added below and another transmission zero 1512 is added above the filter passband 1506 (see FIG. 15(b)). By increasing or decreasing the capacitance value, the position of these TZs can be controlled. Thus, a CRF with tunable TZs is also possible as is described in further detail below.

FIG. 15(a) thus shows a Single CRF 1504 with a parallel feedback capacitance 1502 causing transmission zeros near (below 1510 and above 1512) the passband of 1506 and thus increases the filter skirt roll-off near the passband (response curve 1508 without feedback capacitance; response curve 1506 with feedback capacitance). Response curve 1506 denotes the solid transmission (|S21|) curve of the topology shown in FIG. 15(a). The passband is (in the example shown in FIG. 15(b)) only the frequency region around 2 GHz, where the insertion loss is small. By replacing the feedback capacitance by a tunable capacitance, the transmission zeros can also be tuned.

Serial coupled CRFs are described in further detail below. By connecting two coupled CRFs in series the out-of-band-rejection can be clearly increased. FIG. 16(a) shows two cross-coupled CRFs 1602 and 1610. FIG. 16(b) shows two directly coupled CRFs 1604 and 1612. FIG. 16(c) shows the response curve contrasting a single CRF with two coupled CRFs, according to embodiments. FIG. 16(c) shows the out-of-band-rejection response curve 1608 for a single CRF and the response curve 1606 for two coupled CRFs.

Figure 17A:
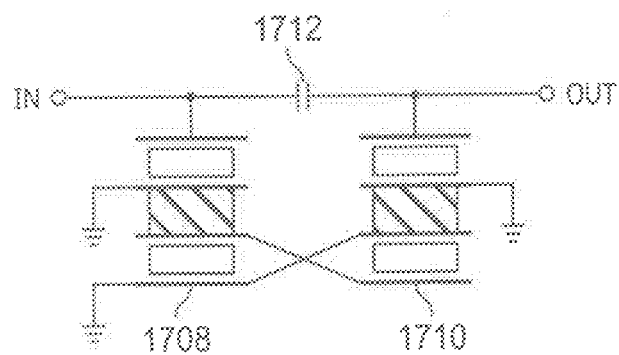
FIGS. 17(a), (b), (c), (d), and (e) are schematic diagrams of series-coupled CRF bandpass filters according to additional embodiments.
Figure 17B:
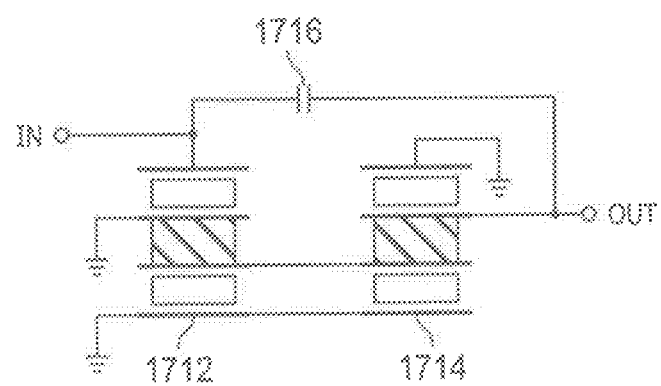
FIG. 17(f) is a graph of the frequency response of the filters shown in FIGS. 17(a), (b), (c), (d), and (e)
FIGS. 17(g), (h), (i), (j), (k), (l), (m), (n), and (o) show schematic diagrams of additional bandpass filter embodiments.
Figure 17C:
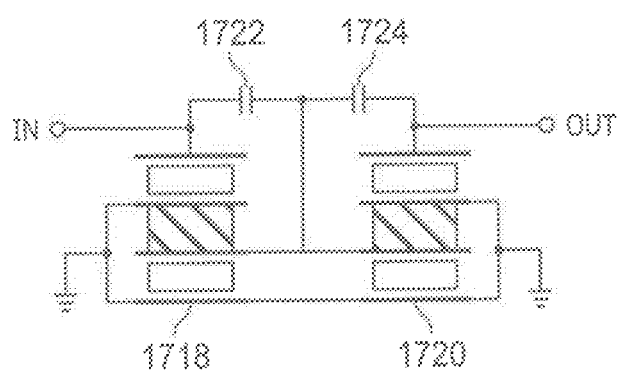
Figure 17D:
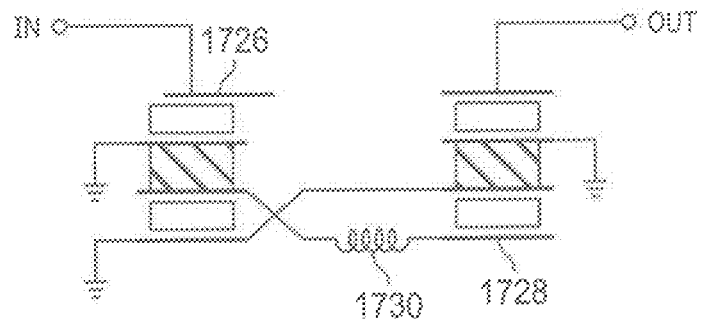
Figure 17E:
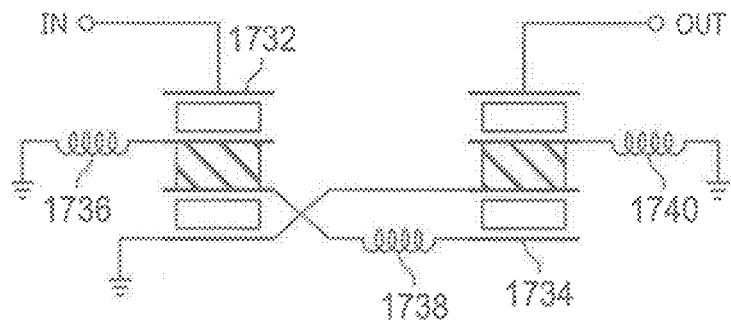

The feedback capacitance and the series coupling of two CRFs, can also be used together. Due to the series coupling several interconnection possibilities arise. Also the addition of inductance to improve the passband behavior can also be used. Some of these possible topologies are depicted in FIGS. 17(a), (b), (c), (d) and (e). By mixing the feedback capacitances and series coupled CRFs, different topologies can be implemented. For example, FIG. 17(a) shows two cross-coupled CRFs 1708 and 1710, and capacitor 1712. FIG. 17(b) shows two directly coupled CRFs 1712 and 1714, and capacitor 1716. FIG. 17(c) shows two directly coupled CRFs 1718 and 1720, wherein the top electrodes of the bottom resonators are coupled together and to a center connection of capacitors 1722 and 1724. FIG. 17(d) shows two cross-coupled CRFs 1726 and 1728, wherein one of the coupling paths is implemented with an inductor 1730. FIG. 17(e) shows two cross-coupled CRFs 1732 and 1734, wherein one of the coupling paths is implemented with an inductor 1738, an additional inductor 1736 is coupled to CRF 1732, and an additional inductor 1740 is coupled to CRF 1734.

Figure 17F:
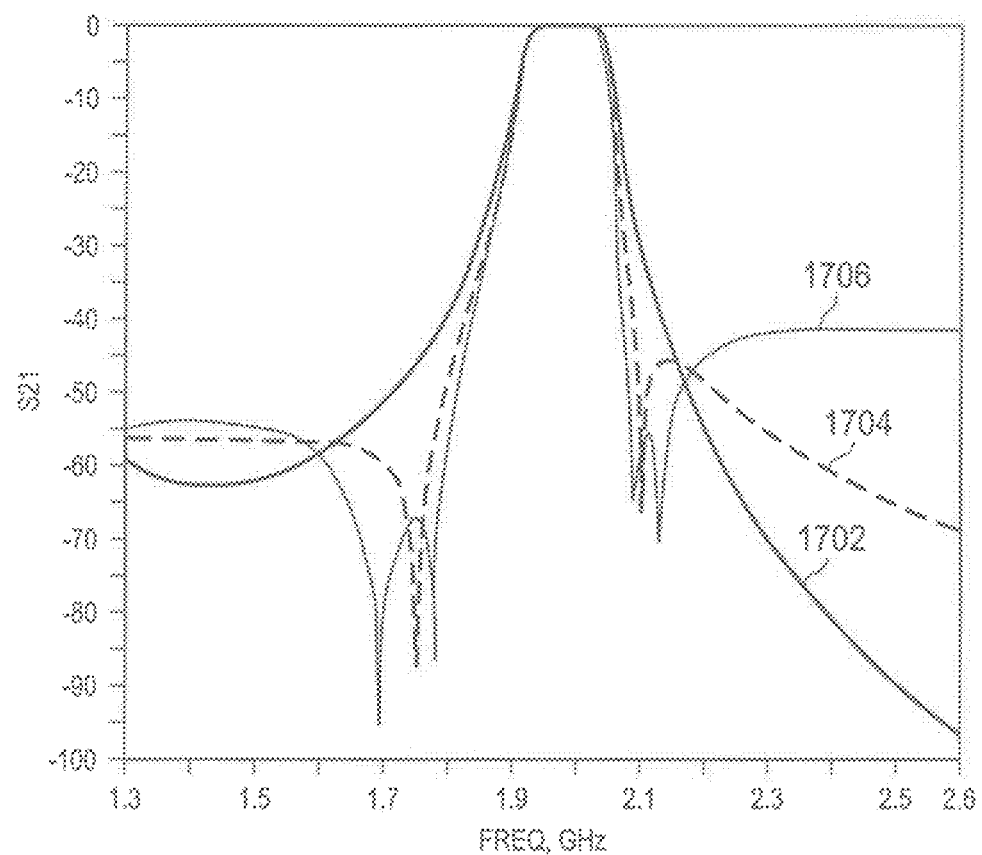

The above filter topologies shown in FIGS. 17(a), (b), and (c) add transmission zeros to the frequency spectrum next to the filter passband. Topologies shown in FIGS. 17(a) and (b) add two transmission zeros (response curve 1704 in the S21 frequency spectrum of FIG. 17(f)), whereas the topology shown in FIG. 17(c) adds four transmission zeros (dashed response curve 1706 in the S21 frequency spectrum of FIG. 17(f)). The topologies shown in FIGS. 17(d) and (e) show a variation of the series coupled CRF, previous described, where inductance is used to improve the filter passband by varying the series CRF coupling strength. The inductances could also be added to the topologies shown in FIGS. 17(a) to (c). The single CRF response is again shown in response curve 1702 of FIG. 17(f).

Additional bandpass topology embodiments are shown in FIGS. 17(g), (h), (i), (j), (k), (l), (m), (n), and (o). For example, FIG. 17(g) shows a cross-coupled filter 1746, wherein the cross-coupling between bottom resonators comprises a network 1740 and a directly coupled filter 1748, wherein the coupling between the bottom resonators also comprises the network 1740. FIG. 17(g) also shows that the network can comprise a capacitor 1742, an inductor 1744, or another component not shown. By adding the network 1740 with capacitors and/or inductors, important filter characters such as bandwidth can be improved. However, other components coupled between the two series CRFs could improve the filter characteristic as well.

Filters 1750 shown in FIG. 17(h), 1752 shown in FIG. 17(j), 1754 shown in FIG. 17(l), and 1756 shown in FIG. 17(n) each comprises an embodiment wherein the network 1740 comprises an inductor. Filters 1758 shown in FIG. 17(i), 1760 shown in FIG. 17(k), 1762 shown in FIG. 17(m), and 1764 shown in FIG. 17(o) each comprises an embodiment wherein the network 1740 comprises a capacitor.

A Tunable Bandpass Filter is described in further detail below. According to embodiments the complexity of RF frontends for e.g. 4G LTE standards is significantly reduced using tunable filters in combination with various topologies that are described below. Thus, tunable versions of the previously described fixed bandpass filters are described. According to embodiments the resonators of the fixed bandpass filter topologies are replaced by tunable resonators to realize a tunable filter. Tunable resonators require more complex resonator devices and/or additional electric tuning components.

By replacing the feedback capacitance previously described by a tunable capacitance the transmission zeros can be made tunable. This substitution is also applicable for the topologies shown in FIGS. 17(a), (b), (c), (d), and (e).

Figure 18A:
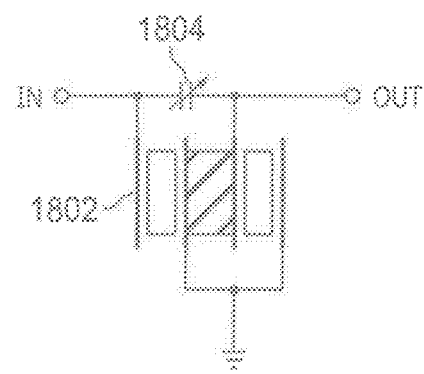
FIG. 18(a) is a schematic of a single CRF bandpass filter with a tunable parallel feedback capacitance according to an embodiment.
Figure 18B:
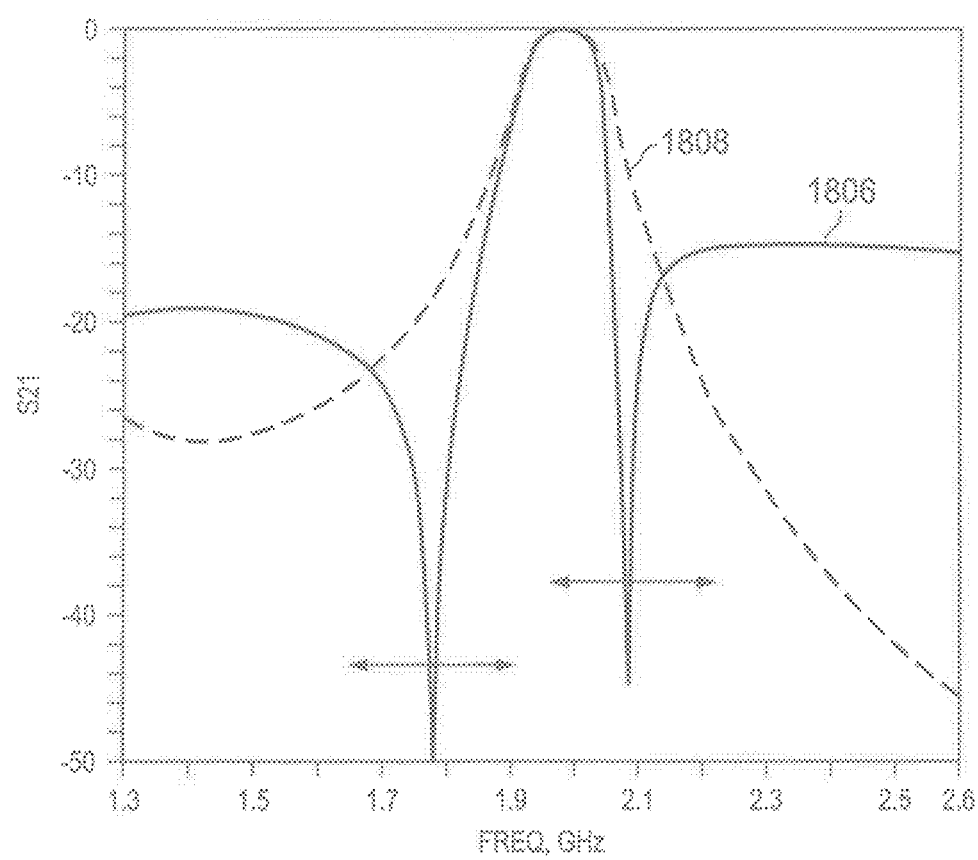
FIG. 18(b) is a graph of the frequency response of the filter shown in FIG. 18(a)

FIG. 18(a) shows a Single CRF 1802 with tunable parallel feedback capacitance 1804 causing tunable transmission zeros near the passband and thus increases the filter skirt roll-off near passband (response curve 1808 without feedback capacitance; response curve 1806 with feedback capacitance).

Furthermore, by using two acoustically coupled SCFs (acoustically coupling through one or three coupling layers with alternating layers of high and low acoustic impedance, for example) as is shown in SCF resonator structure 1902, and accompanying tuning circuits 1904 and 1906, the passband can be tuned. This can be done by replacing the static CRF components of previously described by the acoustically tuned topology shown in FIG. 19.

Figure 19:
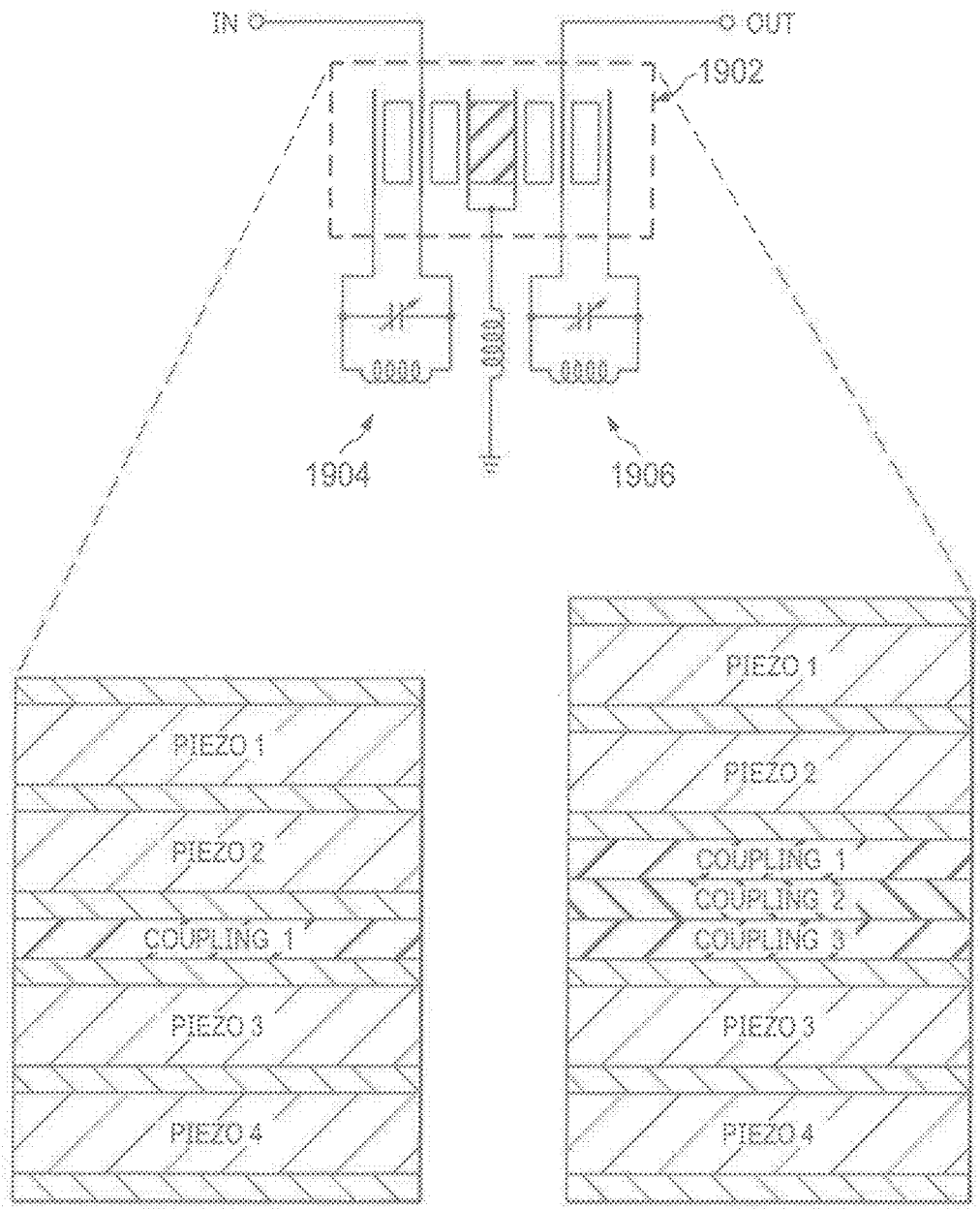
FIG. 19 is a schematic diagram of a tunable bandpass filter comprising an SCF resonator structure coupled to two tuning circuits.

FIG. 19 thus shows two acoustically coupled SCFs in a resonator structure 1902. The SCFs are coupled through one or three layers of alternating high and low acoustic impedance, for example. (Alternatively, other numbers of coupling layers are possible). The outer piezoelectric layers are tuned acoustically (by connecting the corresponding electrodes to tuning circuits 1904 and 1906). This leads to a tunable passband, whereas the qualitative passband behavior is similar to the passband of a single CRF.

SCR/CRR based ladder/lattice-bandpass filters are described below.

A Fixed Bandpass Filter embodiment is described below. As previously described, conventional FBAR/SMR ladder/lattice filters suffer from high area consumption and high insertion loss. Furthermore, their performance strongly depends on the capacitance ratio of the shunt and series elements. Hence, to exhibit a high out-of-band attenuation, the capacitances of these shunt elements has to be much larger than the capacitances of the series resonators. This leads to high area consumption of the shunt elements. Due to the operation principle of a resonator, using SCRs or CRRs helps to decrease the area consumption. This results from the parallel connected characteristic capacitances Co (C_tot=2*Co). So for a high capacitance level, the area of a single SCR/CRR can be chosen to be smaller than a conventional FBAR/SMR (C_tot=Co). In addition, conventional FBAR/SMR devices exhibit a nonlinear behavior, causing the generation of higher harmonics. By using SCRs or CRRs the second order nonlinearity can be intrinsically cancelled out, which makes them interesting for future User Equipment (UEs) for higher power handling capabilities.

Hence, the ladder/lattice topologies using SCR/CRR implementations have smaller area consumption and better linearity than conventional filters using FBAR/SMR implementations. An example for the ladder/lattice topologies with SCR/CRR embodiments is depicted in FIGS. 20(b), (c), and (d) (CRRs) and FIGS. 21(b), (c), and (d) (SCRs).

FIGS. 20(b), (c), and (d) each show an example for a ladder/lattice filter topology using CRRs. FIG. 20(b) shows a bandpass filter comprising a single CRF 2004. FIG. 20(c) shows a bandpass filter comprising a series CRF 2006 and a shunt CRF 2008. FIG. 20(d) shows a lattice filter topology with CRF 2010 coupled between a first input node and a first output node, CRF 2012 coupled between a second input node and a second output node, CRF 2014 coupled between the first input node and the second output node, and CRF 2016 coupled between the first input node and the second output node. The response curve 2002 for the above described bandpass filter is shown in FIG. 20(a).

FIGS. 21(b), (c), and (d) each show an example for a ladder/lattice filter topology using SCRs. FIG. 21(b) shows a bandpass filter comprising a single SCF 2104. FIG. 20(c) shows a bandpass filter comprising a series SCF 2106 and a shunt SCF 2108. FIG. 20(d) shows a lattice filter topology with SCF 2110 coupled between a first input node and a first output node, SCF 2112 coupled between a second input node and a second output node, SCF 2114 coupled between the first input node and the second output node, and SCF 2116 coupled between the first input node and the second output node. The response curve SCF 2102 for the above described bandpass filter is shown in FIG. 21(a).

A Tunable Bandpass Filter is described below. The previous topologies using SCRs/CRRs can also be made tunable by electrical tuning with series inductors/capacitors and parallel capacitors/inductors as depicted in FIGS. 22(a), (b), and (c). FIG. 22(a) shows a tunable resonator 2202, a corresponding CRF bandpass filter including CRF 2204 and tuning circuits 2206 and 2208, and a corresponding SCF bandpass filter including SCF 2210 and tuning circuits 2212 and 2214. FIGS. 22(b) and (c) each show an example for a tunable ladder/lattice filter topology using electrically tuned SCRs/CRRs. The bandpass filter of FIG. 22(b) includes tunable resonators 2216 and 2218 in a ladder topology, and the bandpass filter of FIG. 22(c) includes tunable resonators 220, 2222, 2224, and 2226 in a lattice topology.

Figure 23B:
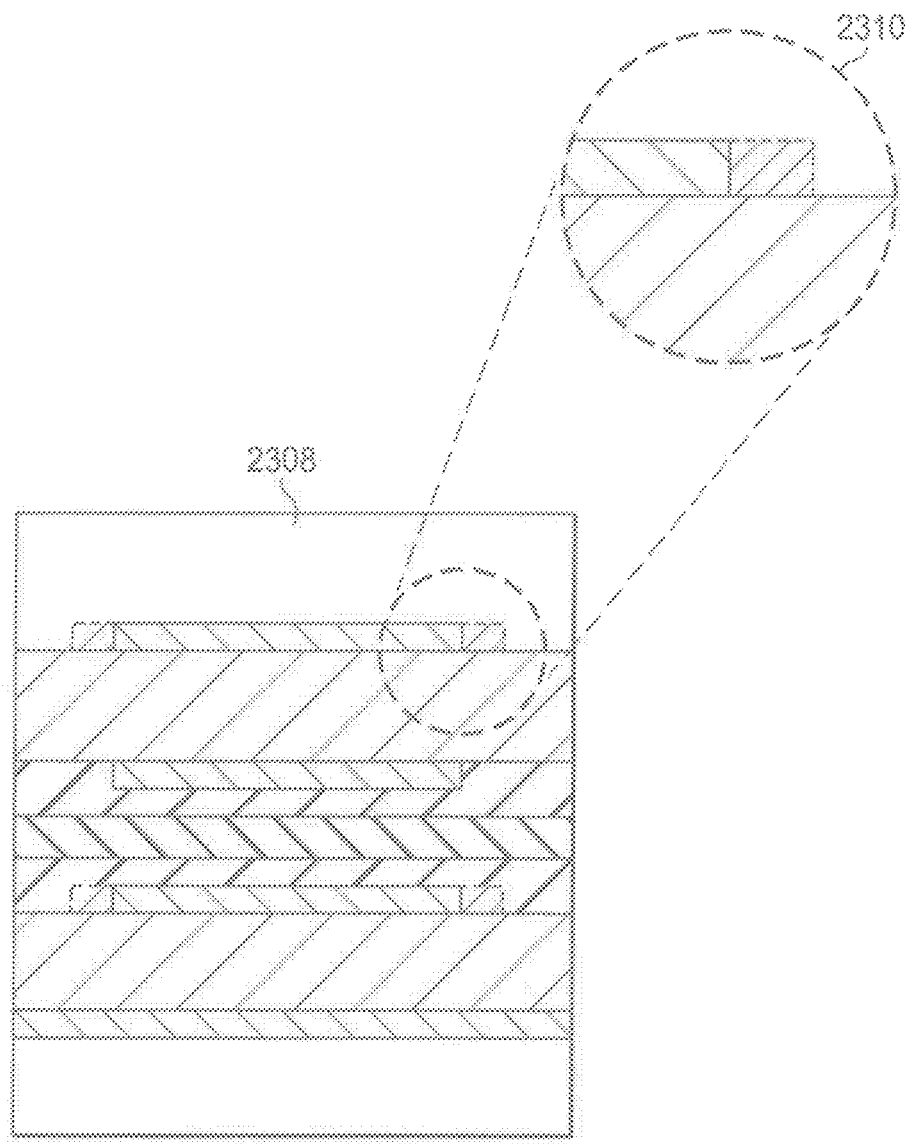
FIG. 23(b) shows a cross-sectional diagram of a resonator structure wherein the top electrode of one of the resonators includes an overlap portion for use as a feedback capacitance in a bandpass filter circuit according to an embodiment.
Figure 23C:
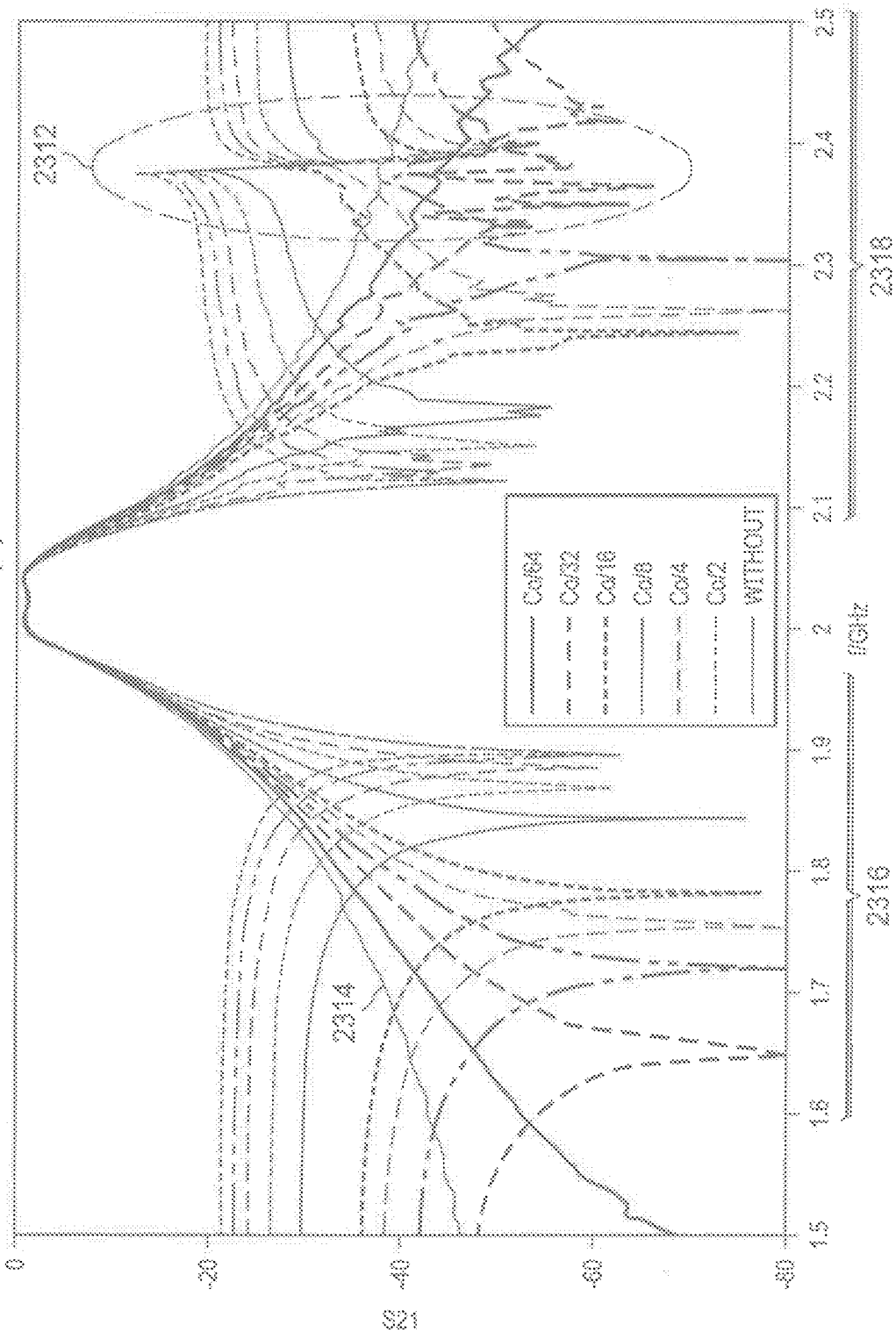
FIG. 23(c) is a graph of the frequency response of the filter of FIG. 23(b) wherein the overlap portion has the same thickness as the top electrode.

Additional implementation examples using a design approach for feedback capacitance using electrode overlaps is discussed below. FIG. 23(b) shows a CRF 2308 wherein a top electrode 2310 of a resonator includes a body portion (solid lines) and an overlap portion (dashed lines). The response curves are shown in FIG. 23(a), wherein a frequency response 2302 without a feedback capacitance, and symmetrical frequency response portions 2304 and 2306 are shown corresponding to various feedback capacitance values without any overlap. FIG. 23(c) shows the frequency response 2314 without a feedback capacitance and the frequency response with the addition of an electrode overlap generates the needed small capacitance for the desired transmission zeros. As can be seen FIG. 23(c), the overlap generates an additional unwanted mode shown in response portion 2312, and the frequency response portions 2316 and 2318 are no longer symmetrical.

Figure 24A:
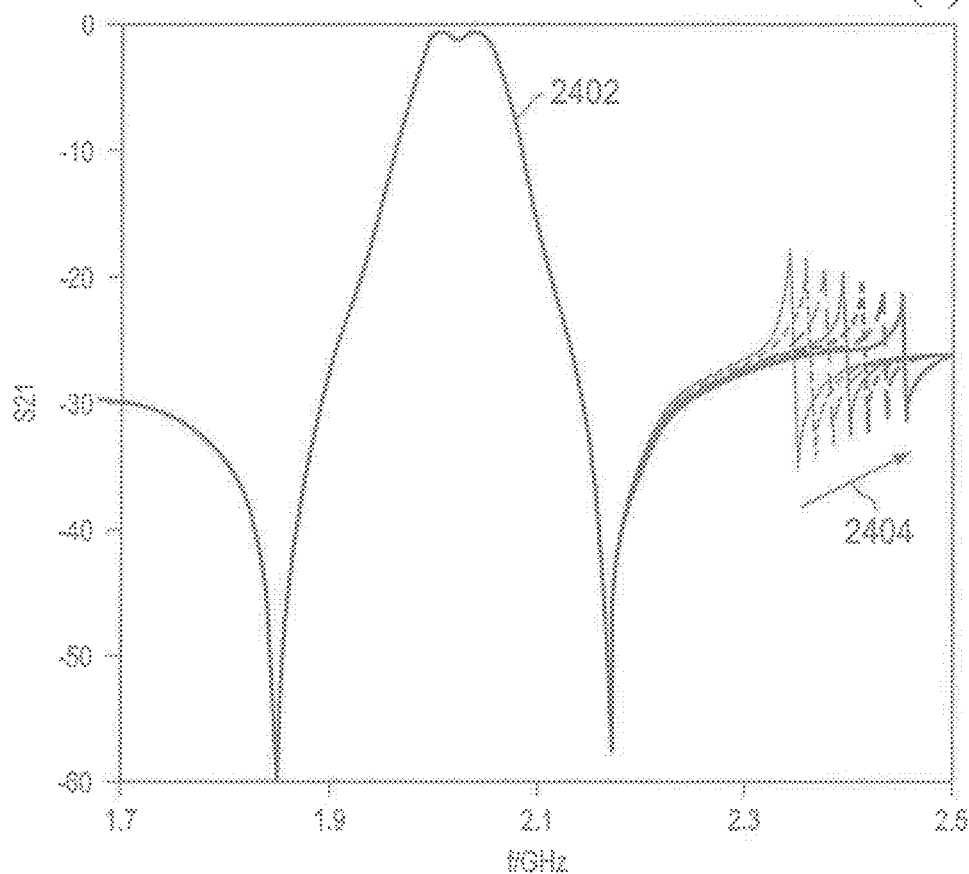
FIG. 24(a) is a graph of the frequency response of the filter of FIG. 24(b) wherein the overlap portion has a different thickness than the top electrode.
Figure 24B:
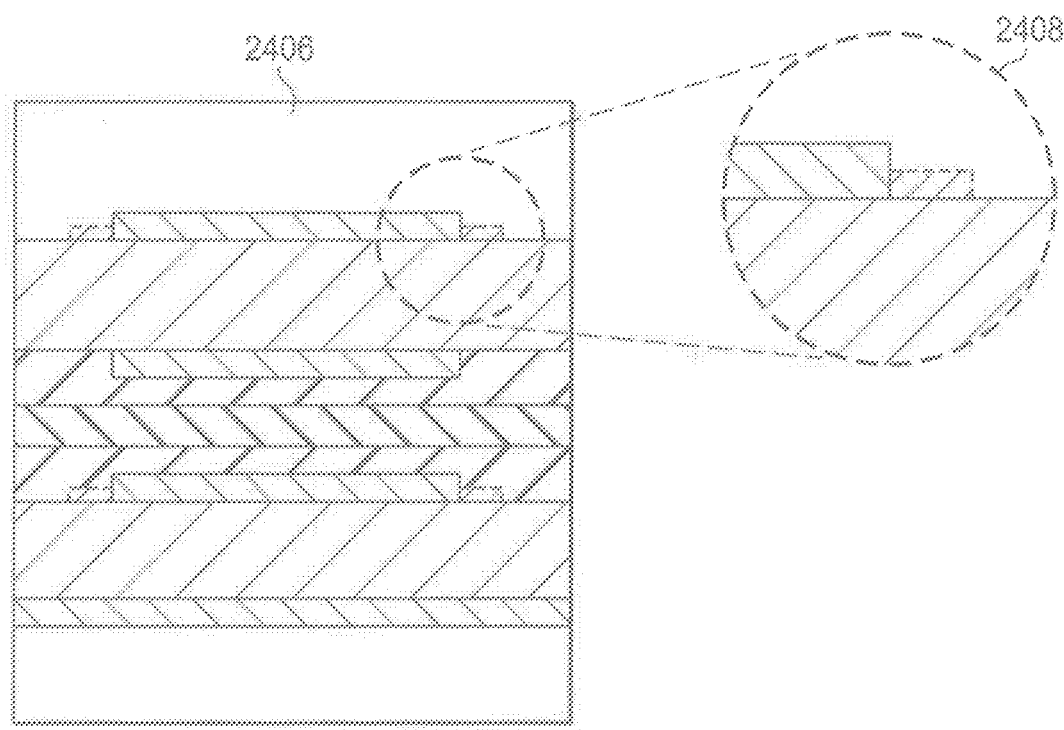
FIG. 24(b) shows a cross-sectional diagram of a resonator structure wherein the top electrode of one of the resonators includes an overlap portion for use as a feedback capacitance in a bandpass filter circuit according to another embodiment.

The bigger the overlap the more significant is the resonance, thus the additional spurious mode could be shifted by changing the overlap thickness. A CRF 2406 is shown in FIG. 24(b) including a top electrode 2408 wherein a body portion (solid lines) has a thickness greater than that of an overlap portion (dashed lines). The response curves 2402 show spurious modes 2404 (resonances from the overlap region) with a resonance frequencies that depend on the thickness of the electrode in the overlap region 2408.

Tunable coupled bandpass filters using acoustically coupled resonators are shown in FIG. 25(b) or electrically tuned resonators, which are shown in FIG. 25(c).

In FIG. 25(a) the series capacitor Co 2504 or 2508 forms a 90 degree phase shifter together with the intrinsic inductance (which corresponds to the reactance of a negative capacitor −Co) of the resonator. This lambda/4 transformation makes shunt devices into series devices and vice versa. As a result this structure acts similar to a ladder structure BPF but using only shunt related structures 2502, 2506, and 2510 and all shunt resonators perform as if they were loaded with an effective capacitor Co. An equivalent structure can be formed with series only resonators, and that approach follows the same laws as the shunt version with the only difference that a T type 90 degree shifting network will be chosen instead, where the series component is moved into the resonators.

FIG. 25(b) thus shows a bandpass filter implementation including capacitors 2516 and 2522 coupled between input and output nodes IN and OUT. Shunt elements are realized by CRF 2512 and tuning circuit 2514, CRF 2520 and tuning circuit 2518, and CRF 2524 and tuning circuit 2526.

Similarly, FIG. 25(c) shows a bandpass filter implementation including capacitors 2534 and 2542 coupled between input and output nodes IN and OUT. Shunt elements are realized by resonator 2530 and tuning circuits 2528 and 2532, resonator 2538 and tuning circuits 2536 and 2540, and resonator 2546 and tuning circuits 2544 and 2548.

An example notch filter is summarized and described below.

A notch filter comprising: a first inductor coupled between an input node and an output node; a second inductor coupled between the input node and an intermediate node; a third inductor coupled between the output node and the intermediate node; a first resonator structure coupled between the input node and ground; a second resonator structure coupled between the output node and ground; a third resonator structure coupled between the intermediate node and the output node.

The notch filter described above, wherein at least one of the resonator structures comprises a stacked crystal filter.

The notch filter described above, wherein at least one of the resonator structures comprises a coupled resonator filter.

The notch filter described above, wherein at least one of the resonator structures comprises a film bulk acoustic resonator.

The notch filter described above, wherein at least one of the resonator structures comprises a tunable resonator structure.

The notch filter described above, wherein the tunable resonator structure comprises a tuning circuit.

The notch filter described above, wherein the tuning circuit comprises a varactor coupled to an inductor.

An example filter system is summarized and described below.

A filter system comprising a plurality of serially-coupled notch filters, wherein at least one of the notch filters comprises an all-pass filter topology configured as a notch filter using at least one resonator structure.

The filter system described above, wherein at least one of the notch filters comprises a stacked crystal filter.

The filter system described above, wherein at least one of the notch filters comprises an acoustically coupled resonator filter.

The filter system described above, wherein at least one of the notch filters comprises an electrically coupled resonator filter.

The filter system described above, wherein at least one of the notch filters comprises a tunable notch filter.

An example filter system is summarized and described below.

A filter system comprising at least one notch filter coupled to at least one bandpass filter, wherein the at least one notch filter comprises an all-pass filter topology configured as a notch filter using at least one resonator structure.

The filter system described above, wherein the at least one notch filter comprises a stacked crystal filter.

The filter system described above, wherein the at least one notch filter comprises an acoustically coupled resonator filter.

The filter system described above, wherein the at least one notch filter comprises an electrically coupled resonator filter.

The filter system described above, wherein the at least one notch filter comprises a tunable notch filter.

Fixed and tunable notch filters and bandpass filters have been described using various resonator implementations, as well as system level combinations of these filters, as well as at least an overlap resonator structure for use with at least some of the described filters.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A notch filter comprising:
   a first dual-resonator structure having a top electrode coupled to an input node, an intermediate electrode, and a bottom electrode;
   a second dual-resonator structure having a top electrode coupled to an output node, an intermediate electrode, and a bottom electrode;
   a first inductor having a first end directly coupled to the input node and a second end coupled to the output node; and
   a second inductor coupled between the intermediate electrode of the first dual-resonator structure and the intermediate electrode of the second dual-resonator structure.

2. The notch filter of claim 1, wherein an additional intermediate electrode of the first dual-resonator structure and an additional intermediate electrode of the second dual-resonator structure are coupled to ground.

3. The notch filter of claim 1, wherein the bottom electrode of the first dual-resonator structure and the bottom electrode of the second dual-resonator structure are coupled together.

4. The notch filter of claim 1, wherein the first and second dual-resonator structures each comprise a coupled resonator filter.

5. The notch filter of claim 1, wherein the first and second dual-resonator structures each comprise a film bulk acoustic resonator.

6. A notch filter comprising:
   a first dual-resonator structure having a top electrode coupled to an input node, an intermediate electrode, and a bottom electrode;
   a second dual-resonator structure having a top electrode coupled to an output node, an intermediate electrode, and a bottom electrode;
   a first inductor having a first end coupled to the input node and a second end directly coupled to the output node; and
   a second inductor coupled between the intermediate electrode of the first dual-resonator structure and the intermediate electrode of the second dual-resonator structure.

7. The notch filter of claim 6, wherein an additional intermediate electrode of the first dual-resonator structure and an additional intermediate electrode of the second dual-resonator structure are coupled to ground.

8. The notch filter of claim 6, wherein the bottom electrode of the first dual-resonator structure and the bottom electrode of the second dual-resonator structure are coupled together.

9. The notch filter of claim 6, wherein the first and second dual-resonator structures each comprise a coupled resonator filter.

10. The notch filter of claim 6, wherein the first and second dual-resonator structures each comprise a film bulk acoustic resonator.

11. A notch filter comprising:
   a first dual-resonator structure having a top electrode coupled to an input node, an intermediate electrode, and a bottom electrode;
   a second dual-resonator structure having a top electrode coupled to an output node, an intermediate electrode, and a bottom electrode;
   a first inductor having a first end coupled to the input node and a second end coupled to the output node; and a second inductor having a first end coupled between the intermediate electrode of the first dual-resonator structure and the intermediate electrode of the second dual-resonator structure and a second end coupled to ground, wherein the second inductor comprises an inductor component external to the first dual-resonator structure and to the second dual-resonator structure.

12. The notch filter of claim 11, wherein an additional intermediate electrode of the first dual-resonator structure and an additional intermediate electrode of the second dual-resonator structure are coupled to ground.

13. The notch filter of claim 11, wherein the bottom electrode of the first dual-resonator structure and the bottom electrode of the second dual-resonator structure are coupled together.

14. The notch filter of claim 11, wherein the first and second dual-resonator structures each comprise a coupled resonator filter.

15. The notch filter of claim 11, wherein the first and second dual-resonator structures each comprise a film bulk acoustic resonator.

16. A method comprising:
filtering a signal using a notch filter comprising a first dual-resonator structure having a top electrode coupled to an input node for receiving the signal, an intermediate electrode, and a bottom electrode; a second dual-resonator structure having a top electrode coupled to an output node for providing a filtered signal, an intermediate electrode, and a bottom electrode; a first inductor having a first end directly coupled to the input node and a second end directly coupled to the output node; and a second inductor coupled between the intermediate electrode of the first dual-resonator structure and the intermediate electrode of the second dual-resonator structure.

17. The method of claim 16, wherein an additional intermediate electrode of the first dual-resonator structure and an additional intermediate electrode of the second dual-resonator structure are coupled to ground.

18. The method of claim 16, wherein the bottom electrode of the first dual-resonator structure and the bottom electrode of the second dual-resonator structure are coupled together.

19. The notch filter of claim 16, wherein the first and second dual-resonator structures each comprise a coupled resonator filter.

20. The notch filter of claim 16, wherein the first and second dual-resonator structures each comprise a film bulk acoustic resonator.

* * * * *